US012740115B2

(12) United States Patent
Sharma et al.

(10) Patent No.: US 12,740,115 B2
(45) Date of Patent: Sep. 15, 2026

(54) ULTRA-SCALED TRANSISTOR DEVICES TO ENABLE CELL SIZE SCALING

(71) Applicant: Intel Corporation, Santa Clara, CA (US)

(72) Inventors: Abhishek Anil Sharma, Portland, OR (US); Wilfred Gomes, Portland, OR (US); Sagar Suthram, Portland, OR (US); Pushkar Ranade, San Jose, CA (US); Rajabali Koduri, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 392 days.

(21) Appl. No.: 17/712,057

(22) Filed: Apr. 1, 2022

(65) Prior Publication Data

US 2023/0317794 A1 Oct. 5, 2023

(51) Int. Cl.

| | |
|---|---|
| ***H10D 62/17*** | (2025.01) |
| ***H10D 30/01*** | (2025.01) |
| ***H10D 30/62*** | (2025.01) |
| ***H10D 84/01*** | (2025.01) |
| ***H10D 84/03*** | (2025.01) |
| ***H10D 84/83*** | (2025.01) |
| ***H10W 40/73*** | (2026.01) |
| *H10D 62/40* | (2025.01) |
| *H10D 62/80* | (2025.01) |

(Continued)

(52) U.S. Cl.

CPC ......... *H10D 62/292* (2025.01); *H10D 30/024* (2025.01); *H10D 30/6211* (2025.01); *H10D 84/0128* (2025.01); *H10D 84/0158* (2025.01); *H10D 84/038* (2025.01); *H10D 84/834* (2025.01); *H10W 40/73* (2026.01); *H10D 62/402* (2025.01); *H10D 62/80* (2025.01); *H10D 62/83* (2025.01); *H10D 62/84* (2025.01)

(58) Field of Classification Search

CPC .. H10D 30/024; H10D 30/67; H10D 30/6735; H10D 30/6757; H10D 62/121; H10D 62/292; H10D 84/0158; H10D 84/834

See application file for complete search history.

(56) References Cited

U.S. PATENT DOCUMENTS

2017/0256615 A1* 9/2017 Chen ...................... H10D 84/83
2020/0058774 A1* 2/2020 Yeh .................... H10D 30/0245
2022/0359444 A1* 11/2022 Cantaloube ............. H01L 24/04

* cited by examiner

*Primary Examiner* — Tuan A Hoang

(74) *Attorney, Agent, or Firm* — Essential Patents Group, LLP

(57) ABSTRACT

Narrow-channel, non-planar transistors and their manufacture on integrated circuit dies. A method includes forming channel portions of transistors from sidewall spacers by removing backbone features and coupling a gate structure, a source, and a drain to the channel portions. An integrated circuit die includes a gate structure, a source, and a drain coupled to pair-symmetric channel portions with sidewalls of differing heights. A method includes iteratively etching away portions of semiconductor material not covered by a mask or a passivation layer, revealing a channel portion by removing the mask and passivation layer, and coupling a gate structure, a source, and a drain to the channel portion. An integrated circuit die includes a gate structure, a source, and a drain coupled to a channel portion with vertically alternating, greater and lesser widths.

10 Claims, 16 Drawing Sheets

(51) Int. Cl.
*H10D 62/83* (2025.01)
*H10D 62/84* (2025.01)

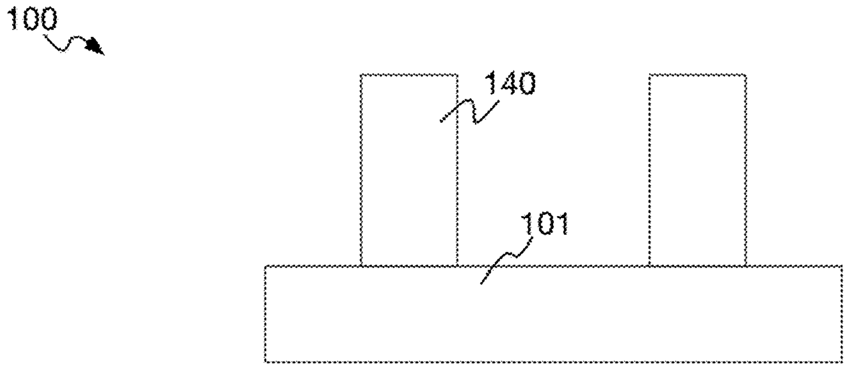
FIG. 1A
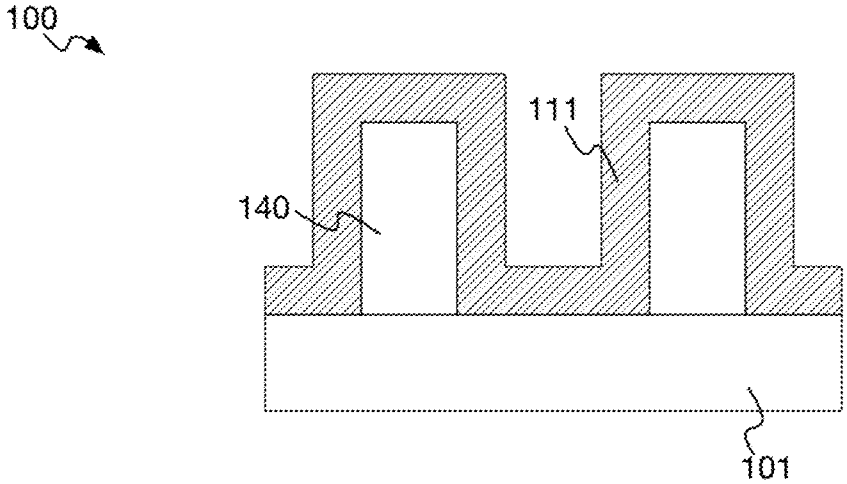
FIG. 1B
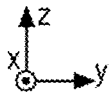

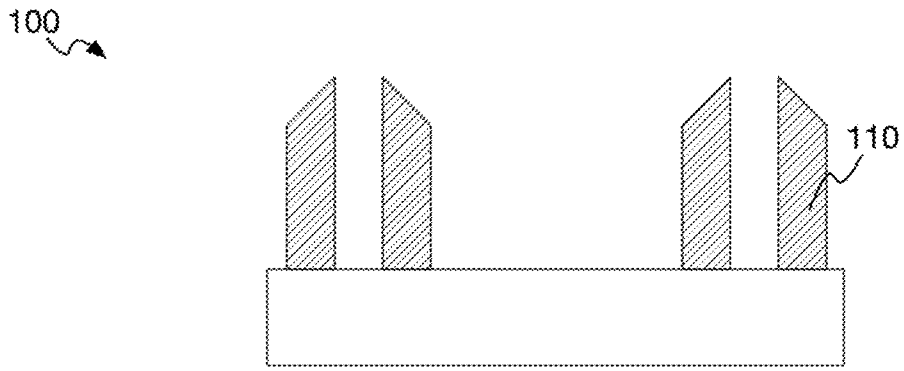
FIG. 1E
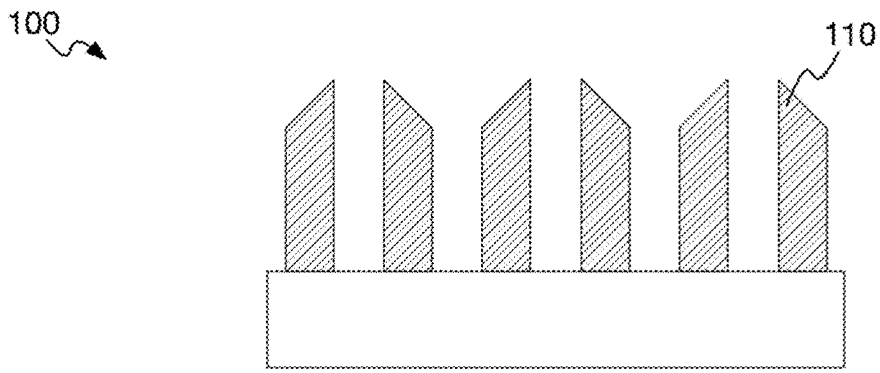
FIG. 1F
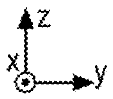

ULTRA-SCALED TRANSISTOR DEVICES TO ENABLE CELL SIZE SCALING

BACKGROUND

Non-planar transistors can allow for shorter switching times and higher current densities. Non-planar field-effect transistors (FETs) can be thought of as increasing effective device width and available device current by dividing the channel of a wide, planar FET into many channels of narrow width, which in turn allows for improved device scaling. Reducing actual channel width can be overcome by dividing a relatively wide channel into many narrow channels having more sidewall conduction. Sidewall conduction can be increased by making taller channels.

It is with respect to these and other considerations that the present improvements have been needed. Such improvements may become critical with the ever-increasing demand to manufacture FETs with small dimensions, such as narrow channels, or to more easily scale these dimensions, including the heights of narrow channels.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 1A, 1B, 1C, 1D, 1E, and 1F illustrate cross-sectional profile views of an example integrated circuit die, including exemplary structures as operations of an exemplary backbone-spacer process flow for manufacturing non-planar transistor fins;

DETAILED DESCRIPTION

Figure 1C:
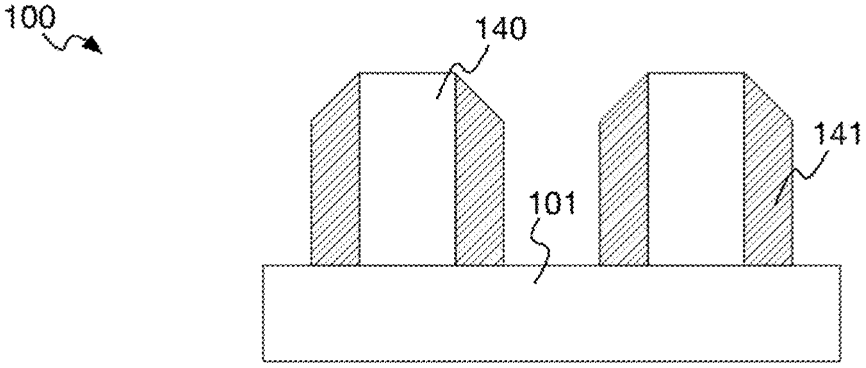

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, thermal, magnetic, or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top," "bottom," "above," and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent. Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Integrated circuit dies, systems, and techniques described herein relate to the scaling of the lateral dimensions of semiconductor devices, particularly in the manufacture of non-planar transistors. Improved control of device dimensions can improve control of device performance. For example, the conductance or current density of transistor channels can be manipulated by altering the channel dimensions. Capacitive loading can be reduced by reducing device parasitic parameters, which depend directly on device dimensions. The ability to manufacture devices of smaller footprint can provide flexibility in circuit design and layout. As such, methods to manufacture narrow fins at least for channels of non-planar transistors are described below. These methods may be practiced to precisely control the feature-to-feature pitch of these fins or channels. Further, given a certain channel width and other lateral constraints, improved methods are provided herein to manufacture narrow fins with precisely controlled heights.

Some of the benefits of these improved manufacturing techniques are enhanced by certain materials or by improving the conditions under which the manufactured devices operate. To counter the effect of reducing the cross-sectional area of conducting channels, improved conduction can be achieved by using materials with improved conductivities. In some embodiments, integrated circuits have non-planar transistors with channels of ultra-thin materials, such as single-layer or two-dimensional (2D) materials. In some embodiments, integrated circuits have non-planar transistors with channels of high-conductivity materials.

Many integrated circuit devices see a substantial boost in conductivity when operating at very low temperatures. In particular, semiconductor devices operating at very low temperatures have increased carrier mobility and saturation velocity, as well as reduced leakage and contact resistance. In some embodiments, the performance of integrated circuits having narrow-channel, non-planar transistors is enhanced by very low operating temperatures to the point that the lateral width of the channel can be reduced below the point where the transistor, if operated at over standard temperature, would lack sufficient drive current for most applications. Active-cooling structures may be integrated with narrow channel transistors to reach a very low operating temperature, such as, below −25° C., or more advantageously −50° C.

As used herein, a "cooling structure" or an "active-cooling structure" is a device that uses power to provide cooling (e.g., via flow of a coolant, immersion in a coolant, etc.). Notably, the cooling structure or active cooling structure need not be in operation to be labeled as such. The cooling structure may be part of the integrated circuit die, provided separate from the integrated circuit die, or both. If an active-cooling structure is not used, the narrow channel devices described herein may still be suitable in a very low temperature environment, such as in any of a subpolar oceanic climate, a subarctic climate, an arctic climate, a tundra climate, an ice cap climate, extraterrestrial environment, or any other environment of sustained cold temperatures. In some embodiments, the operating temperature of the integrated circuit die is maintained below about −70° C. (e.g., within the cryogenic regime). In some embodiments, the integrated circuit die is maintained at or below about −25° C. In some embodiments, the integrated circuit die is maintained at or below about −50° C. In some embodiments, the integrated circuit die is maintained at or below about −70° C. In some embodiments, the integrated circuit die is maintained at or below about −100° C. Such temperatures may be achieved with liquid nitrogen as a coolant, for example. Other temperatures may be used based on coolant, environment, and so on.

Figure 1D:
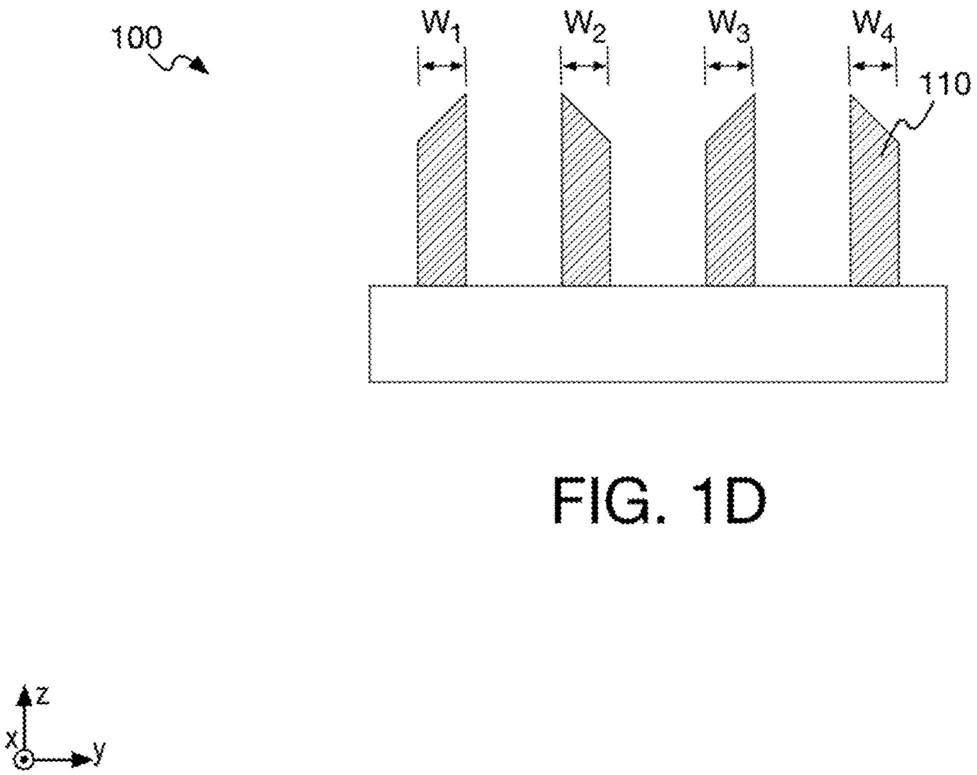

FIGS. 1A, 1B, 1C, 1D, 1E, and 1F illustrate cross-sectional profile views of an example integrated circuit die 100, including exemplary structures as operations of an exemplary backbone-spacer process flow for manufacturing non-planar transistor fins 110, arranged in accordance with at least some implementations of the present disclosure. As shown in FIGS. 1A-1F, four parallel fins 110 are formed as spacers by patterning backbone features 140 on substrate 101, depositing semiconductor material layer 111 over backbone features 140 and substrate 101, and removing excess semiconductor material layer 111 and backbone features 140. Four resulting example fins 110 are shown in FIG. 1D running parallel and in the x-direction. FIGS. 1E and 1F show how the spacing of fins 110 can be adjusted by adjusting the widths and spacing of backbone features 140. Channels can be formed from portions or the entirety of fins 110. In some embodiments, fins 110 are vertical channels sharing a source, a drain, and a gate structure in a single non-planar transistor. Sources and drains can connect to, or be formed from portions of, fins 110.

FIG. 1A shows integrated circuit die 100 after backbone features 140 have been patterned onto substrate 101. Substrate 101 may be one of many layers in integrated circuit die 100. Substrate 101 may be above other layers in integrated circuit die 100 (all or of a portion of which may be subsequently removed in back-side metallization contexts), and other layers may subsequently be formed over substrate 101. Substrate 101 may be below other layers in integrated circuit die 100. Although other layers are sometimes referred to as being, e.g., lower, or above or below another layer, it is recognized that a "lower" layer in one orientation can be an "upper" layer by reversing the orientation. For example, many operations that can be performed on a substrate's surface can also be performed on an opposite surface of the same substrate. Substrate 101 may include any suitable material or materials. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V alloy material (e.g., gallium arsenide (GaAs)), a silicon carbide (SiC), a sapphire (Al2O3), or any combination thereof. In some examples, substrate 101 may include silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, substrate 101 may be (111) silicon, (100) silicon, or (110) silicon. In an embodiment, substrate 101 includes a (111) crystalline group IV material.

Backbone features 140 can be patterned to control the channel-to-channel pitch of the eventual channels formed from fins 110. Pairs of fins 110 can be formed with one fin 110 on either side of each backbone feature 140, so narrow backbone features 140 can be patterned to make small spaces between paired fins 110. In some embodiments, backbone features 140 are patterned relatively closely together to make small spaces between adjacent pairs of fins 110. In some embodiments, fins 110 are 3 nm wide at a pitch of about 6 nm. In some embodiments, backbone features 140 are patterned relatively largely and farther apart to allow for larger fin pitches. In some embodiments, fins 110 are 3 nm wide at a pitch of about 10 nm. In some embodiments, fins 110 are 5 nm wide at a pitch of about 20 nm. Although not to scale, FIGS. 1E and 1F illustrate examples of how backbone features 140 can affect the relative spacing of fins 110.

Backbone features 140 can be patterned and formed from any suitable material. In some embodiments, backbone features 140 are formed from a dielectric material. In some embodiments, backbone features 140 are formed from a conducting material, e.g., a precursor metal, such as tungsten or molybdenum, to react with a precursor gas to form semiconductor material layer 111 on backbone features 140.

FIG. 1B shows integrated circuit die 100 after semiconductor material layer 111 has been formed over backbone features 140 and substrate 101. Semiconductor material layer 111 can be any material suitable for forming a transistor channel, but some materials will be preferred for their manufacturing properties, e.g., the capability to be deposited easily, in a well-controlled manner, and in thin layers. Semiconductor material layer 111 can be chosen to optimize certain characteristics or capabilities given other features within an embodiment. In some embodiments, semiconductor material layer 111 includes materials with high carrier mobilities. In some embodiments, semiconductor material layer 111 includes ultrathin materials, e.g., 2D materials. In some embodiments, a monolayer of semiconductor material layer 111 is deposited over backbone features 140 and substrate 101. In some embodiments, a few monolayers of semiconductor material layer 111 are deposited over backbone features 140 and substrate 101. In some embodiments, a deposited film of semiconductor material layer 111 over backbone features 140 and substrate 101 is less than 1 nm thick. In some embodiments, a deposited film of semiconductor material layer 111 over backbone features 140 and substrate 101 is in the range of 3 to 5 nm thick. In some embodiments, a deposited film of semiconductor material layer 111 over backbone features 140 and substrate 101 is not more than 3 nm thick. In some embodiments, semiconductor material layer 111 includes a transition-metal dichalcogenide (TMD) material. TMDs are compounds that include chalcogenides, e.g., any of sulfur, selenium, or tellurium, and transition metals, which are defined to include any element in the d-block of the periodic table, i.e., group 3 through group 12, and any element in the f-block of the periodic table, i.e., "inner transition metals." Dichalcogenides include twice as many chalcogenide as transition metal atoms. TMDs can be 2D materials, e.g., forming monolayers of semiconductor materials. In some embodiments, semiconductor material layer 111 includes molybdenum or tungsten. In some embodiments, semiconductor material layer 111 includes sulfur, selenium, or tellurium. In some embodiments, semiconductor material layer 111 includes one or more metals and one or more of sulfur, selenium, or tellurium.

In some embodiments, semiconductor material layer 111 includes amorphous or polycrystalline materials that include a metal and oxygen, such as a metal oxide. In some embodiments, semiconductor material layer 111 includes a thin, metal-oxide film that may be semiconducting substantially as-deposited, and/or following some subsequent activation process, such as a thermal anneal. Oxide semiconductor materials primarily include one or more metals (M1, M1M2, M1M2M3, etc.) and oxygen. The metal(s) may be from the transition metals (e.g., IUPAC group 4-10) or post-transition metals (e.g., IUPAC groups 11-15). The metal oxide compounds may be suboxides ($A_2O$), monoxides (AO), binary oxides ($AO_2$), ternary oxides (e.g., $ABO_3$), and mixtures thereof, for example. In some embodiments, semiconductor material layer 111 includes oxygen and at least one of Mg, Cu, Zn, Sn, Ti, In, Ga, or Al.

Semiconductor material layer 111 may include any atomic concentration ratio of metal constituents. For example, a binary metal alloy $M1_yM2_{1-y}$ may include any atomic percent of a first metal (M1) and a complementary atomic percent of a second metal (M2), or metalloid/non-metal. A ternary alloy $M1_yM2_zM3_{1-y-z}$ may include any atomic percent of metal M1, any atomic percent of metal M2, and a complementary atomic percent of a third metal (M3), such that y and z are both greater than 0, but sum to less than 1. In some specific embodiments, semiconductor material layer 111 includes a zinc oxide ($ZnO_x$), such as Zn(II) oxide, or ZnO, zinc peroxide ($ZnO_2$)m or a mixture of ZnO and $ZnO_2$. In some specific embodiments, semiconductor material layer 111 includes $ZnO_x$ and indium oxide $InO_x$ (e.g., $In_2O_3$). In some further embodiments, semiconductor material layer 111 includes a composition of indium, gallium, zinc, and oxygen (IGZO), e.g., zinc oxide, indium oxide, and gallium oxide (e.g., $Ga_2O_3$). The metal atomic composition ratio, for example Ga to each of In and Z (Ga:In:Z), may vary. In some examples, semiconductor material layer 111 includes a Ga-rich IGZO.

Semiconductor material layer 111 may include one or more dopants such as another metal or a nonmetallic dopant, such as N, O, H, F, Cl, Si, or Ge, that may introduce electron vacancies or oxygen vacancies. Whether metallic or non-metallic, most dopants can be readily detected along with the metal majority constituents by one or more chemical analysis techniques, such as X-ray photoelectron spectroscopy, energy dispersive spectroscopy, or electron energy loss spectroscopy.

Semiconductor material layer 111 may have any morphology or microstructure. In some embodiments, semiconductor material layer 111 is substantially amorphous (i.e., having no discernable long-rang order) or slightly crystalline. However, depending on the substrate and the deposition process, semiconductor material layer 111 may be more-ordered polycrystalline (e.g., microcrystalline or nanocrystalline) metal oxide material.

Semiconductor material layer 111 may be deposited to a thickness of less than 1 nm and up to 20 nm, for example. The oxide semiconductor thickness can be chosen to optimized selected transistor channel characteristics, for example, high carrier mobility and a material band gap and resistivity that is tunable by a dopant that impacts the charge carrier (e.g., electron) concentrations.

The thickness of semiconductor material layer 111 deposited over backbone features 140 and substrate 101 sets the maximum width of eventual fins 110. Subtractive methods, e.g., anisotropic etching, can reduce the size of the layer of semiconductor material layer 111 and eventual fins 110 to less than this upper bound.

FIG. 1C shows integrated circuit die 100 after excess semiconductor material layer 111 has been removed, leaving pairs of sidewall spacers 141 on sidewalls of backbone features 140, one on either side of backbone features 140, and on substrate 101. Subtractive processes can remove semiconductor material layer 111 from above and between backbone features 140, while retaining a thickness of semiconductor material layer 111 immediately adjacent to a sidewall of backbone features 140. In some embodiments, excess semiconductor material layer 111 is removed by anisotropic etch. The eventual size of fins 110 can be reduced to less than what was initially deposited when semiconductor material layer 111 was formed on backbone features 140. The pairs of fins 110 may still be contiguous with each other, as they may remain in continuous loops around their respective backbone features 140. Further subtractive methods can be used to selectively remove localized portions of semiconductor material layer 111 where desired, e.g., to electrically isolate certain fins 110 from other fins 110. In some embodiments, fins 110 remain and excess semiconductor material layer 111 is removed by using photoresist methods. In some embodiments, photoresist methods are used to remove semiconductor material layer 111 from the ends of backbone features 140, e.g., along the y-z plane in FIG. 1C, but leave fins 110 from the sides of backbone features 140.

The subtractive process used to remove excess semiconductor material layer 111 is evident from the generally trapezoidal profiles of the remaining structures, sidewall spacers 141. The widths at the tops of fins 110 are narrower than the widths at the bottoms of sidewall spacers 141. Although the profiles in FIG. 1C (and later) are illustrated and described as trapezoidal, the various sides, tops, etc., of the resultant structures may not actually be completely planar or meet at abrupt edges or corners. These faces and intersections may be at least slightly curved or rounded.

The backbone-spacer process is evidenced by the asymmetric profiles of sidewall spacers 141. Although individual sidewall spacers 141 are not symmetric, adjacent pairs of sidewall spacers 141 are symmetric about their respective backbone features 140, with taller sidewalls facing in (towards the respective backbone feature 140 and the paired sidewall spacers 141), and shorter sidewalls facing out (away from the respective backbone feature 140 and the paired sidewall spacers 141).

FIG. 1D shows integrated circuit die 100 after undesired backbone features 140 have been removed from substrate 101, and previous sidewall spacers 141 can be seen as individual fins 110. Backbone features 140 can be removed, e.g., by selectively etching the material backbone features 140 are formed from.

Fins 110 have thin widths $W_1$, $W_2$, $W_3$, and $W_4$, on the order of a few nanometers, and potentially smaller than 1 nm. Whereas such narrow widths would not offer sufficient drive current at typical operating temperatures, fin widths of this scale become more advantageous as carrier mobility and saturation velocity increases for the fin material at very low operating temperatures. Again, the trapezoidal profiles are indicative of the subtractive process used earlier in removing some of, e.g., semiconductor material layer 111. The asymmetric (but pair-symmetric) profiles are evidence of the backbone-patterning process used in forming fins 110.

Transistors will be formed using fins 110, with each transistor having one or more channel portions (or simply channels). Each channel portion is a portion of a fin 110 between a source and a drain structure (e.g., source and drain semiconductors). A gate structure is formed over the channel portion one or more fins 110 to control the flow of charge carriers in each transistor from the source to drain. The gate structure may include a gate dielectric layer on at least portions of channel portions and between channel portions and a gate electrode of the gate structure, such that the gate electrode controls channel portions during transistor operation. Such structures are discussed further below.

Although still not to scale, FIGS. 1E and 1F show how the width and spacing of backbone features 140 can affect the spacing of fins 110.

FIG. 1E shows an example of integrated circuit die 100 with some paired fins 110 spaced closely together, but further apart from another pair of fins 110, due to having thin backbone features spaced further apart.

FIG. 1F shows a similar example of integrated circuit die 100 with paired fins 110 spaced closely together, and with pairs of fins 110 spaced closely to other pairs of fins 110, due to having thin backbone features spaced relatively closely.

As discussed earlier, subtractive methods can be used to selectively remove localized portions of semiconductor material layer 111 to control the size, shape, and layout of fins 110 on the x-y plane where desired and, if necessary, e.g., to electrically isolate certain features from other features. In some embodiments, excess semiconductor material layer 111 is removed before and after backbone features 140 are removed.

Figure 2:
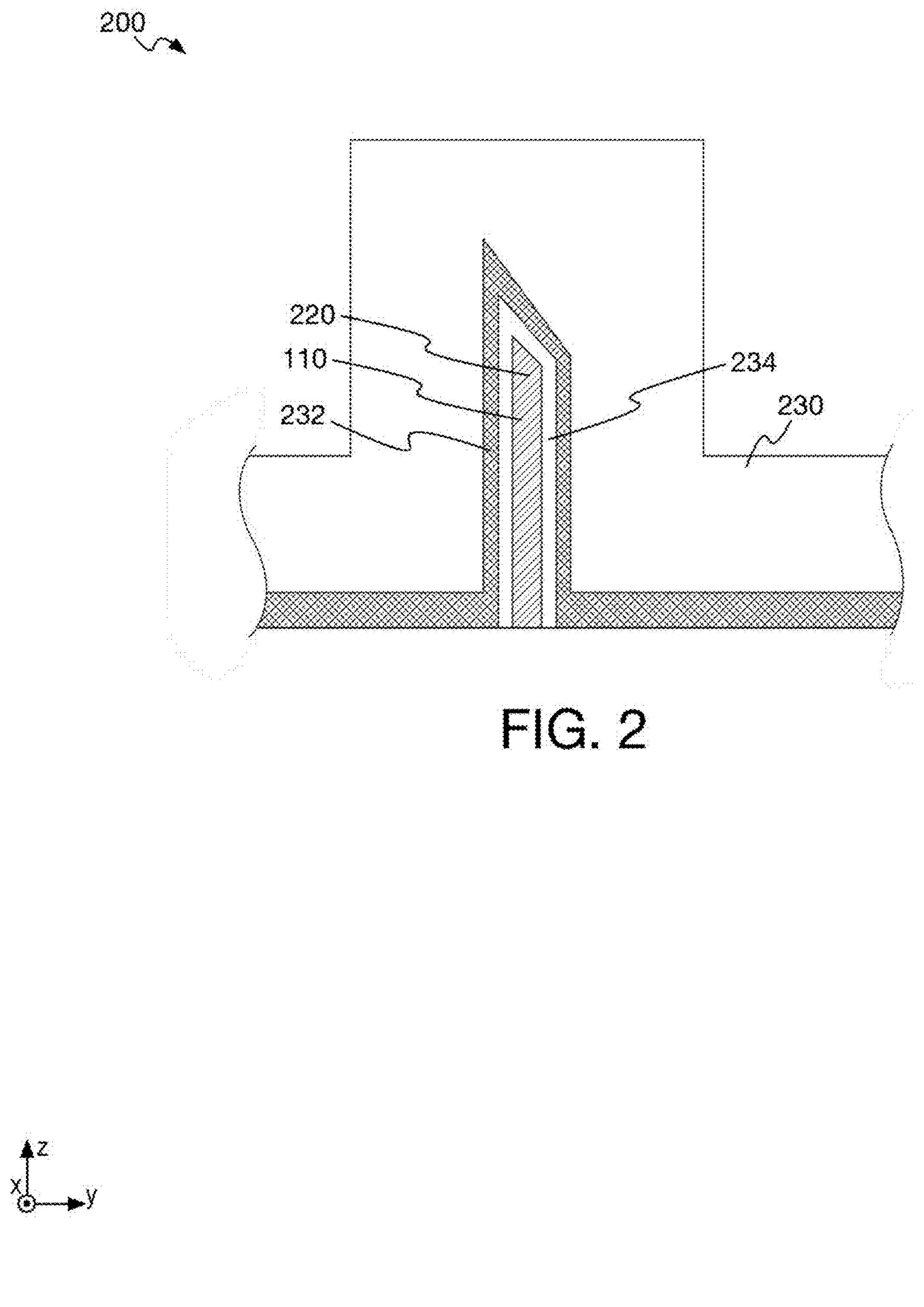
FIG. 2 illustrates a cross-sectional side view of a portion of an example non-planar transistor, including a fin providing a channel portion.

FIG. 2 illustrates a cross-sectional side view of a portion of an example non-planar transistor 200, including fin 110 providing a channel portion 220, arranged in accordance with at least some implementations of the present disclosure. As used herein, the term channel portion indicates a portion of a fin between a source and a drain and coupled to a gate structure. Notably, a channel portion, in operation, is under control of the gate structure to provide current flow switching between the source and the drain. A single fin 110 is shown, including channel portion 220, covered by an optional interface layer 234 between fin 110 and a gate dielectric layer 232, such as a gate oxide. A gate structure, including gate dielectric layer 232 and a gate electrode 230, can be seen crossing over fin 110.

Non-planar transistor 200 may have a plurality of fins 110 and channel portions 220. The fin 110 shown in FIG. 2 runs in the x-direction through the visual plane, and gate electrode 230 crosses over fin 110 in the y-direction and continues to the right and left of the illustration. In some embodiments, fins 110 run parallel to and on either side of the shown fin 110, and gate electrode 230 crosses over the plurality of fins 110. In some embodiments, non-planar transistor 200 has a single channel in fin 110. In some embodiments, a source and a drain are formed from either end of fin 110, on either side of the viewing plan in FIG. 2, with channel portion 220 in that portion of fin 110 between them. In some embodiments, a source and a drain are grown on the ends of fin 110.

Gate electrode 230 is an electrically conducting material coupled to fin 110 to control the flow of charge carriers through the channel of fin 110. Exemplary materials for gate electrode 230 are discussed further below. Gate dielectric layer 232 is an electrically insulating material between the channel of fin 110 and gate electrode 230. Gate dielectric layer 232 can be any suitable material. The one or more layers of gate dielectric layer 232 may include silicon oxide, silicon dioxide ($SiO_2$), and/or a high-k dielectric material. In some embodiments, gate dielectric layer 232 is an oxide layer thermally grown before forming gate electrode 230 over the channel. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in gate dielectric layer 232 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 232 to improve its quality when a high-k material is used.

Interface layer 234 is optional, but can be used depending on, e.g., the materials used for fin 110 and gate dielectric layer 232. In some embodiments, interface layer 234 is a high-k dielectric material deposited as a film over fin 110. In some embodiments, gate dielectric layer 232 is a metal oxide and interface layer 234 includes a nitride to significantly reduce gate capacitance without significant detriment to other transistor performance metrics, such as drive current. In some embodiments, gate dielectric layer 232 is a metal oxide and interface layer 234 includes an additional metal oxide or nitride to increase breakdown voltage and/or drive current.

Figure 3A:
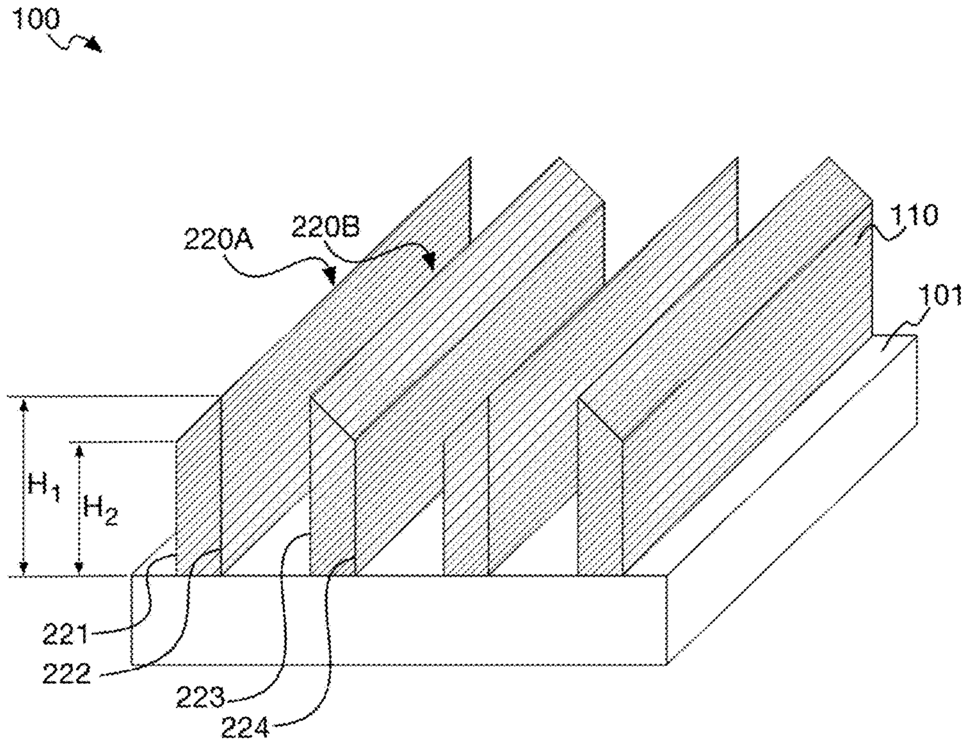
FIGS. 3A and 3B illustrate orthographic projections of an example integrated circuit die, including multiple fins.
Figure 3B:
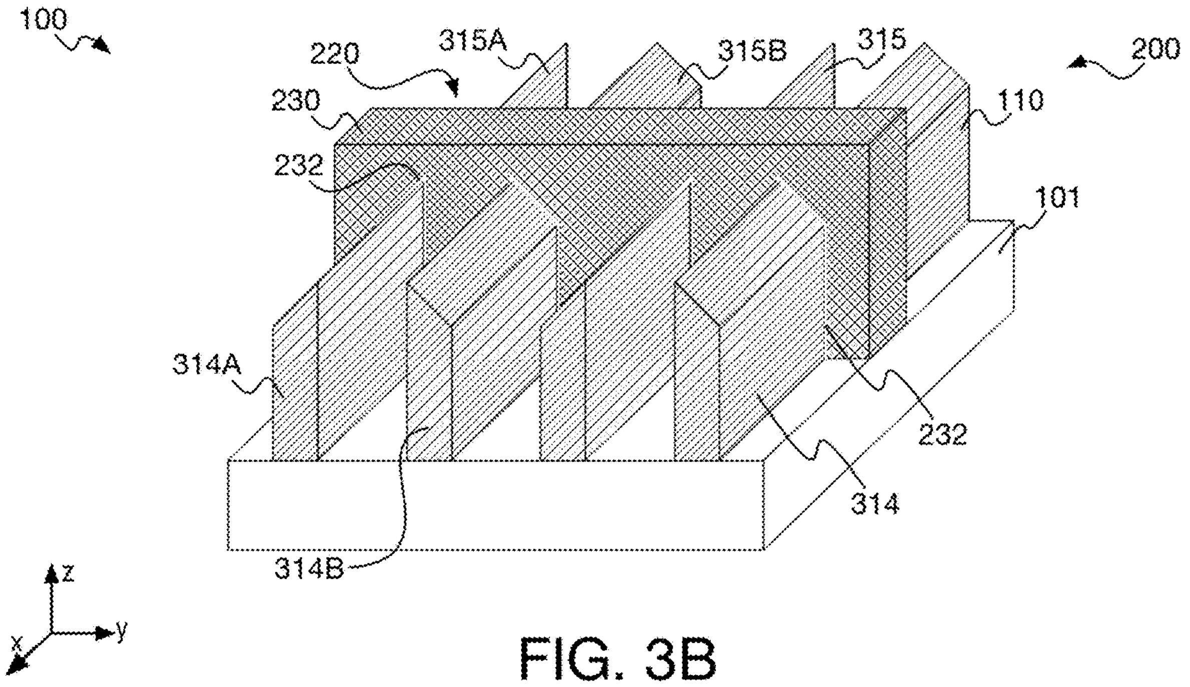

FIGS. 3A and 3B illustrate orthographic projections of an example integrated circuit die 100, including multiple fins 110, arranged in accordance with at least some implementations of the present disclosure. FIG. 3A shows four example fins 110 rising vertically from substrate 101 and running in the x-direction. FIG. 3B shows example non-planar transistor 200 with the same four fins 110 providing channel portions 220 (obscured by gate dielectric layer 232 and gate electrode 230 in FIG. 3B) coupled to source structures 314, drain structures 315, and a gate structure, including gate electrode 230 and gate dielectric layer 232.

As illustrated in in FIG. 3A, one or more fins 110 may be formed. In the example shown in FIG. 3A, four parallel fins 110 have been formed as sidewall spacers on backbones using a backbone-spacer method as previously discussed. The backbone-spacer method used is evident from the asymmetric, trapezoidal profiles of fins 110, where pairs of fins 110 have taller sidewalls facing each other on the interiors of the pairs where the backbones had been prior to removal. The size and spacing of the backbones used determines in part the sizes and spacing of fins 110. The pitch between adjacent channels is set both by the width of backbones and by the spacing between them. The backbone widths influence the pitch between paired fins 110, and the backbone spacing influences the pitch between adjacent, but unpaired (i.e., formed from spacers not sharing a backbone), fins 110. The heights of backbones influence the heights of fins 110, and the lengths of backbones influence the maximum lengths of fins 110.

Before being obscured by the addition of a gate structure in FIG. 3B, channel portions 220 (including first and second channel portions 220A, 220B) can be seen. Each fin 110 has a channel portion 220 under where a gate structure will be added and between where source and drain structures will be. Fins 110 share sidewalls with their constituent channel portions 220. First channel portion 220A shares a first sidewall 221 and an opposing second sidewall 222 with its fin 110. Second channel portion 220B shares a third sidewall 223 and an opposing fourth sidewall 224 with its fin 110. Second channel portion 220B is substantially parallel to first channel portion 220A, and third sidewall 223 is laterally adjacent second sidewall 222. As discussed, the trapezoidal sidewalls 222, 223 that were adjacent a backbone feature are taller than the outer sidewalls 221, 224, i.e., second and third sidewalls 222, 223 have the same first height, $H_1$, greater than a second height, $H_2$, shared by first and fourth sidewalls 221, 224.

FIG. 3B shows non-planar transistor 200 with a gate structure formed over and coupled to four fins 110. Gate electrode 230 is on the gate dielectric layer 232 and may include one layer or a stack of layers. Gate electrode 230 may include at least one of a p-type work function metal or an n-type work function metal, depending on whether the transistor is a PMOS or an NMOS transistor. In some embodiments, gate electrode 230 is a stack of two or more metal layers, where one or more metal layers are work function metal layers and at least one metal layer is a fill metal layer. For a PMOS transistor, metals that may be used for the gate electrode include, but are not limited to, ruthenium, palladium, platinum, cobalt, nickel, and conductive metal oxides, e.g., ruthenium oxide. A p-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An n-type metal layer will enable the formation of an NMOS gate electrode with a work function that is between about 3.9 eV and about 4.2 eV.

Fins 110 of non-planar transistor 200 provide channel portions 220 (obscured by gate dielectric layer 232 and gate electrode 230 in FIG. 3B) that extend between source structures 314 and drain structures 315. Source structures 314 and drain structures 315 may be the opposite conductivity type with respect to channel portions 220. For example, for NMOS transistors, source structures 314 and drain structures 315 are n-type materials and, for PMOS transistors, source structures 314 and drain structures 315 are p-type materials. In some embodiments, source structures 314 and drain structures 315 are semiconductor materials doped with the pertinent conductivity type dopants. For example, n-type dopants include phosphorous, arsenic, and antimony and p-type dopants include boron and gallium. In some embodiments, source structures 314 and drain structures 315 are formed from fin 110 and coupled to channel portions 220. For example, source structures 314 (including first and second source structures 314A, 314B) are formed from their fins 110 and coupled to first and second channel portions 220A, 220B, as are drain structures 315 (including first and second drain structures 315A, 315B). In other embodiments, source structures 314 and drain structures 315 may be epitaxially grown from channel portions 220 (e.g., using etch and epitaxial growth processing) as is known in the art. In such embodiments, source structures 314 and drain structures 315 are blocks (or faceted blocks) of material that do not match the shape of fin 110.

Channel portions 220 are of a particular conductivity type (e.g., p-type or n-type) depending on the conductivity type and operational type of non-planar transistor 200. Similarly, source and drain structures 314, 315 are of a particular conductivity type (e.g., p-type or n-type) depending on the conductivity type of non-planar transistor 200. Gate electrode 230 and source and drain structures 314, 315 may be contacted by a gate contact and source and drain contacts (not shown) as known in the art.

Figure 4:
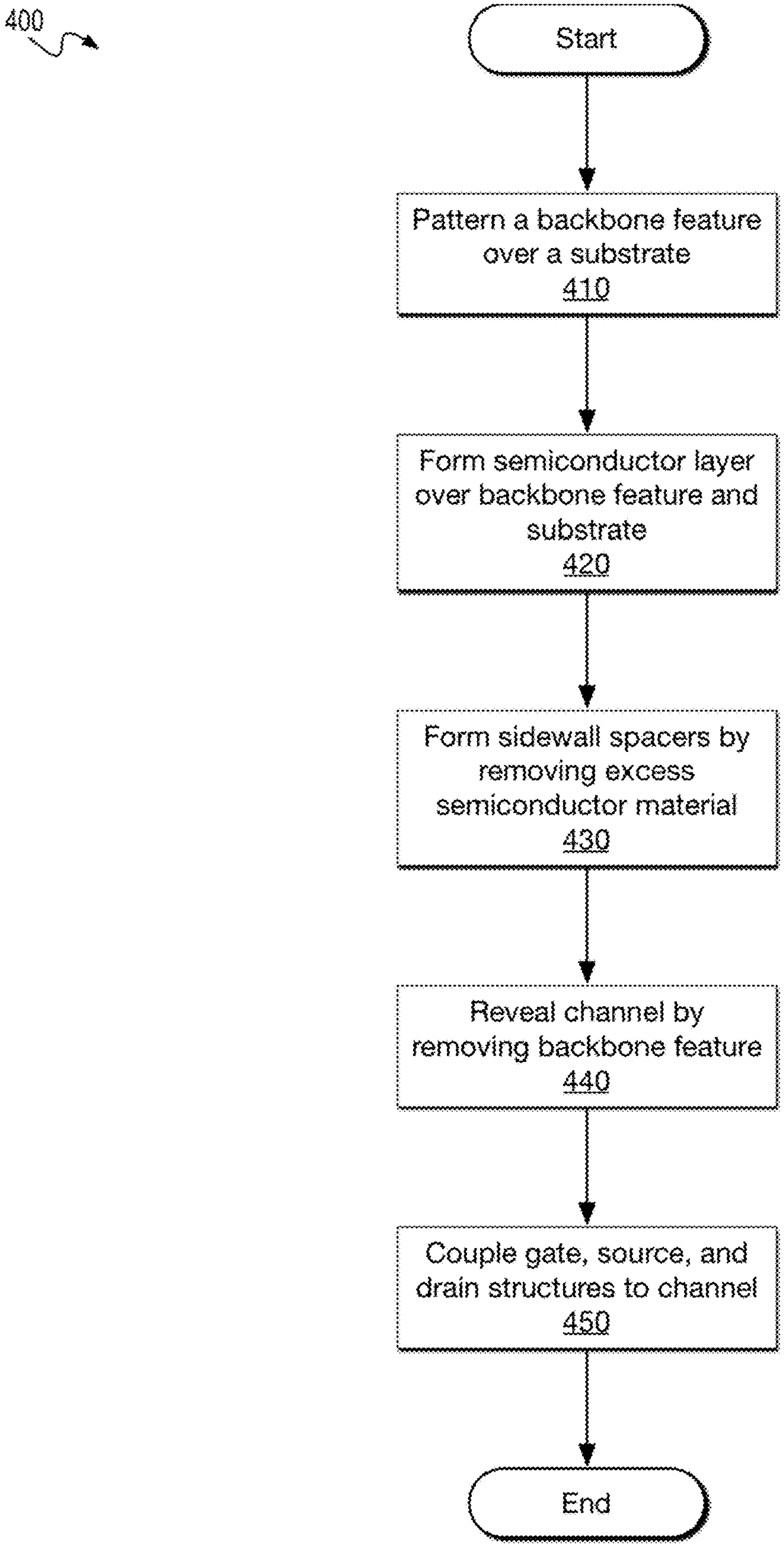
FIG. 4 illustrates various processes or methods for forming non-planar transistor fins as sidewall spacers.

FIG. 4 illustrates various processes or methods 400 for forming non-planar transistor fins as sidewall spacers, arranged in accordance with at least some implementations of the present disclosure. FIG. 4 shows operations 410, 420, 430, and 440 using a backbone-spacer process. The operations include patterning backbone features over a substrate; forming semiconductor material over the backbone features; removing excess semiconductor material (to form sidewall spacers) and backbone features (to reveal the sidewall spacers as fins and channels from the fins); and coupling gate, source, and drain structures to the vertical fins as channels.

As shown in operation 410 of FIG. 4, a feature is patterned on a substrate, e.g., a layer in an integrated circuit die. In some embodiments, the substrate is in an integrated circuit die and is received as part of a wafer also having many other integrated circuit dies. The features can be thought of as backbone features as subsequent materials will be formed over these patterned features. In some embodiments, the backbone features include nonconductive materials. In some embodiments, the backbone features include oxygen, such as an oxide material. In some embodiments, the backbone features include nitrogen, such as a nitride material. In some embodiments, the backbone features serve as precursor materials for later forming a layer (or multiple layers) of semiconductor material from. In some embodiments, an outer layer of a backbone feature serves as a seed layer for growing or depositing a layer (or multiple layers) of semiconductor material on.

Sidewall spacers, and eventually fins, will be formed from the subsequent materials to be formed over the backbone features, so the sizes, shapes, and locations of the backbone features will influence the layout of the eventual fins to be formed. Wide backbone features will result in fins with correspondingly wide fin-to-fin pitches. Tall backbone features can result in fins with correspondingly tall sidewalls facing those backbone features. Relatively wide backbone features, and backbone features patterned relatively far from other backbone features, will result in fins spaced correspondingly far from each other, i.e., relatively wide pitches.

An example substrate and backbone features were shown in FIG. 1A. Two backbone features 140 had been patterned on that example integrated circuit die substrate 101, but in some embodiments, one backbone feature 140 is patterned on substrate 101. In some embodiments, three or more backbone features 140 are patterned on substrate 101. In some embodiments, tens of thousands or more backbone features 140 are patterned on substrate 101.

Returning to FIG. 4, in operation 420, a layer (or multiple layers) of semiconductor material can be formed on, e.g., deposited over, the backbone features and the substrate or, optionally, an interface layer formed on the backbone features and the substrate. Forming an interface layer is not a required operation, but may be beneficial in some embodiments, e.g., with certain material combinations or especially thin layers of semiconductor material. An intermediate interface layer between the backbone features and the semiconductor material may serve as, e.g., a seed layer for depositing a film of the semiconductor material or as a precursor material for forming the semiconductor material.

In some embodiments, the layer(s) of semiconductor material are ultrathin. In some embodiments, the layer(s) of semiconductor material are less wide than 1 nm. In some embodiments, the layer(s) of semiconductor material are formed from the backbone features. In some embodiments, the layer(s) of semiconductor material include ultrathin materials, e.g., 2D materials, such as TMDs. In some embodiments, the layer of semiconductor material is a monolayer of TMD formed from an interface layer of a precursor metal on a backbone feature, e.g., by a reaction with a precursor chalcogen gas. In some embodiments, the layer(s) of semiconductor material include ruthenium or tungsten. In some embodiments, the layer(s) of semiconductor material include sulfur, selenium, or tellurium.

In some embodiments, an oxide semiconductor material layer 111 is deposited by PVD where a target of a desired alloy composition may be sputtered in an inert or reactive environment. In accordance with other embodiments, semiconductor material layer 111 is deposited with an ALD process. The ALD deposition process may entail cyclically depositing a precursor of each of a plurality of metals during a deposition phase of separate ALD cycles, and oxidizing the deposited precursor of each of a plurality of metals during an oxidation phase of each of the cycles. An example layer of semiconductor material layer 111 was shown in FIG. 1B formed over substrate 101 and backbone features 140. Semiconductor material layer 111 could optionally be formed over an interface layer (not shown).

Returning to FIG. 4, excess semiconductor material is removed from above and between the backbone features lines by, e.g., an anisotropic etch in operation 430. Until excess material is removed, the formed semiconductor material may be part of one or more uninterrupted layers of semiconductor material. An anisotropic etch will remove material from surfaces facing upwards, which can result in a tapered, e.g., trapezoidal, profile with a narrower top and wider bottom. As this taper is wider at the bottom and there is a sidewall spacer on either side of the backbone pair, these sidewall-spacer pairs will have taller sidewalls facing in (towards the respective backbone feature and the paired sidewall spacer), and shorter sidewalls facing out (away from the respective backbone feature and the paired sidewall spacer). An example was shown in FIG. 1C with excess semiconductor material layer 111 removed leaving sidewall spacers 141 on either side of backbone features 140 on substrate 101.

Returning to FIG. 4, backbone features are removed in operation 440. The sidewalls are liberated from the backbone features, and the sidewalls are revealed as fins (and the channels fully revealed), when the backbone features are removed, e.g., by selective etching, from the substrate. FIG. 1D shows example substrate 101 after backbone features 140 are removed and example fins 110 are revealed.

In some embodiments, an interface layer is formed on, e.g., deposited over, the backbone features and the substrate, and the interface layer has portions removed, e.g., by anisotropic etch, before a semiconductor material is formed on the interface layer. In some embodiments, the backbone features are removed, e.g., by etching, before a semiconductor material is formed on the interface layer. In some embodiments, the backbone-spacer process is repeated with a spacer from a first iteration of the process being used as a backbone in a second iteration. In some embodiments, a first-iteration spacer (and second-iteration backbone) will be formed from a conductive or non-conductive material and a second-iteration spacer will be formed from a semiconductor material.

Returning to FIG. 4, non-planar transistors are formed when, in operation 450, the one or more channels are coupled each to a source, drain, and gate structure. Vertical fins can each provide a channel for separate transistors, or multiple vertical fins can be used in a single transistor. Source structures can be formed from, grown on, or connected to channels in the fins. Drain structures can be formed from, grown on, or connected to channels in the fins. Vertical fins can each provide a channel coupled to separate gate structures, or multiple vertical fins can be used in a single transistor, e.g., coupled to a single gate structure. FIG. 3B shows example non-planar transistor 200 on substrate 101 in integrated circuit die 100 after channel portions 220 in fins 110 are coupled to source structures 314, drain structures 315, and a gate structure, including gate electrode 230 and gate dielectric layer 232.

Figure 5A:
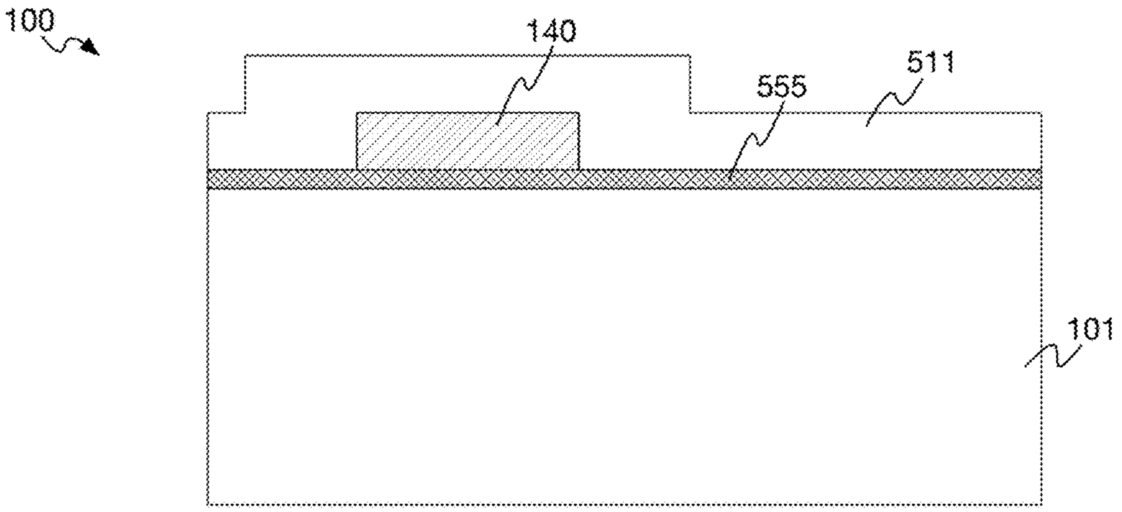
FIGS. 5A, 5B, 5C, 5D, 5E, 5F, 5G, 5H, 5I, 5J, 5K, 5L, 5M, 5N, and 5O illustrate cross-sectional profile views of an example integrated circuit die, including exemplary structures as operations of an exemplary process flow for manufacturing non-planar transistor channels or fins.

FIGS. 5A, 5B, 5C, 5D, 5E, 5F, 5G, 5H, 5I, 5J, 5K, 5L, 5M, 5N, and 5O illustrate cross-sectional profile views of an example integrated circuit die 100, including exemplary structures as operations of an exemplary process flow for manufacturing non-planar transistor channels or fins 110, arranged in accordance with at least some implementations of the present disclosure. As shown in FIGS. 5A-5O, a vertical fin 110 with a beaded appearance is formed by selectively etching away unmasked portions of layers of semiconductor material from substrate 101. The process includes a number of operations before the etching away of semiconductor material, e.g., by patterning a backbone feature 140 on substrate 101, depositing masking material 511 over backbone feature 140 and substrate 101, and removing backbone feature 140 and excess masking material 511 to leave one of the sidewall spacers, now a mask feature 541. One or more successive etches form a feature, i.e. vertical fin 110, by removing semiconductor material not covered by mask feature 541 or passivation layer 555 formed over the remaining semiconductor material. This remaining semiconductor feature 510 grows taller as more semiconductor material is removed from substrate 101, and fin 110 is revealed when mask feature 541 is removed. Some operations can optionally be repeated before fin 110 is revealed to grow semiconductor feature 510 taller. In this way, fin 110 can be made taller or the height of fin 110 can be controlled digitally by iteratively repeating selected passivation, passivation-removal, and etch operations.

Some operations can narrow the vertical fin 110 by etching away semiconductor material only somewhat covered by or adjacent to mask feature 541 or passivation layer 555. The beaded appearance results from successive narrowing etches leaving vertically alternating greater and lesser widths along the height of fin 110, e.g., adjacent to and away from passivation material, respectively, and one or more rounding etches removing sharp protrusions 515. The "beaded" appearance referred to is in the cross-section orthogonal to the length of the fins and does not imply that the width and the length of the fin are comparable (as might be the case with a spherical or cylindrical bead). The fin is typically longer than it is wide, and the respective cross-sections vary accordingly.

Figure 5B:
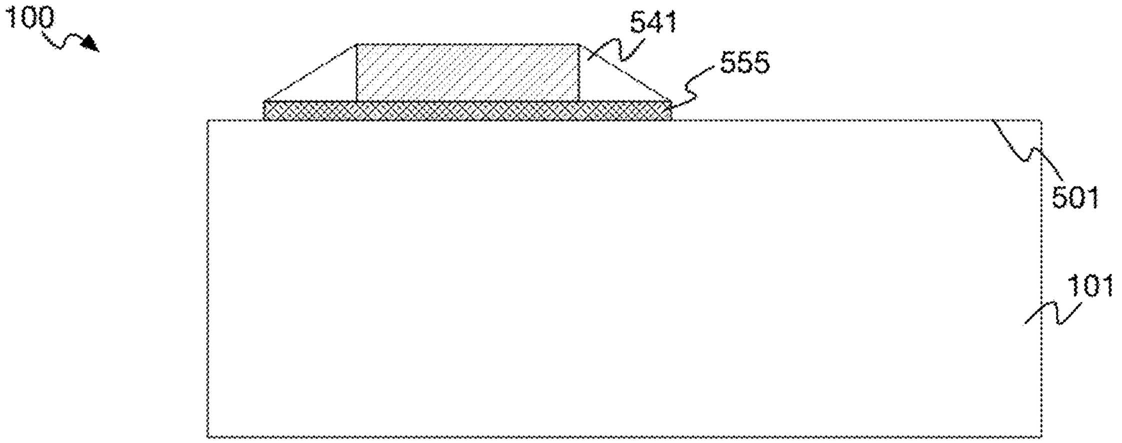
Figure 5C:
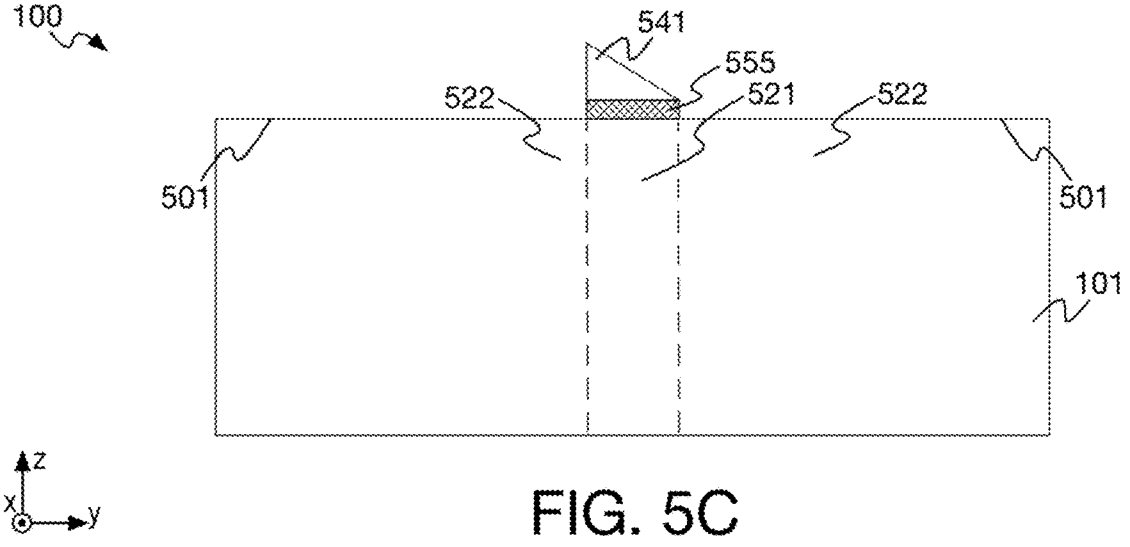
Figure 5D:
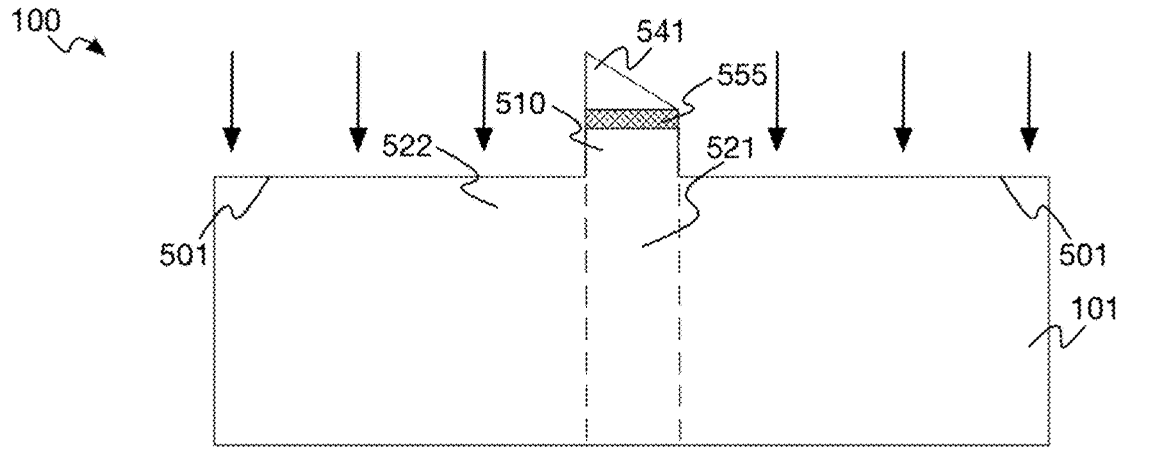
Figure 5E:
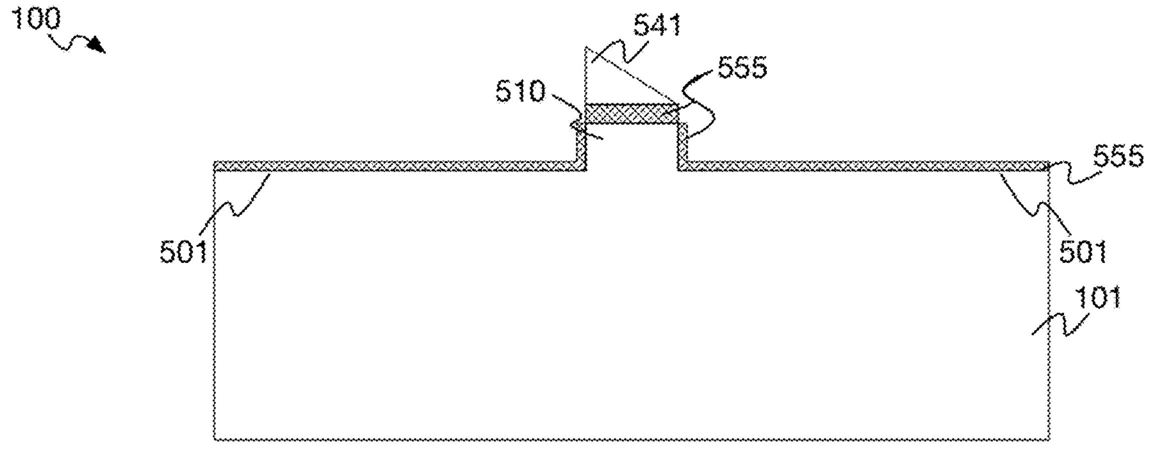
Figure 5F:
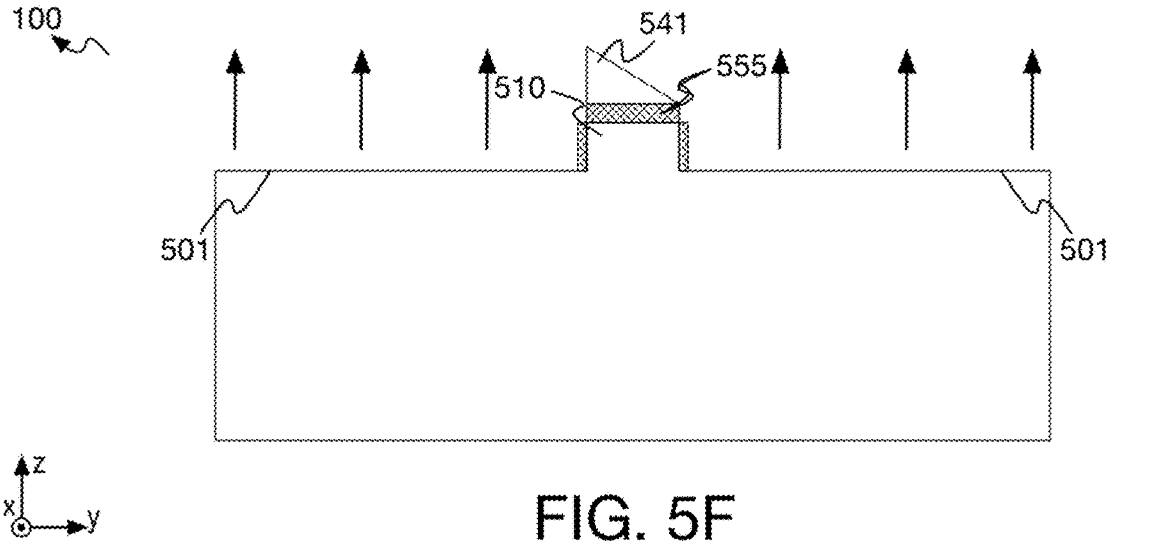
Figure 5G:
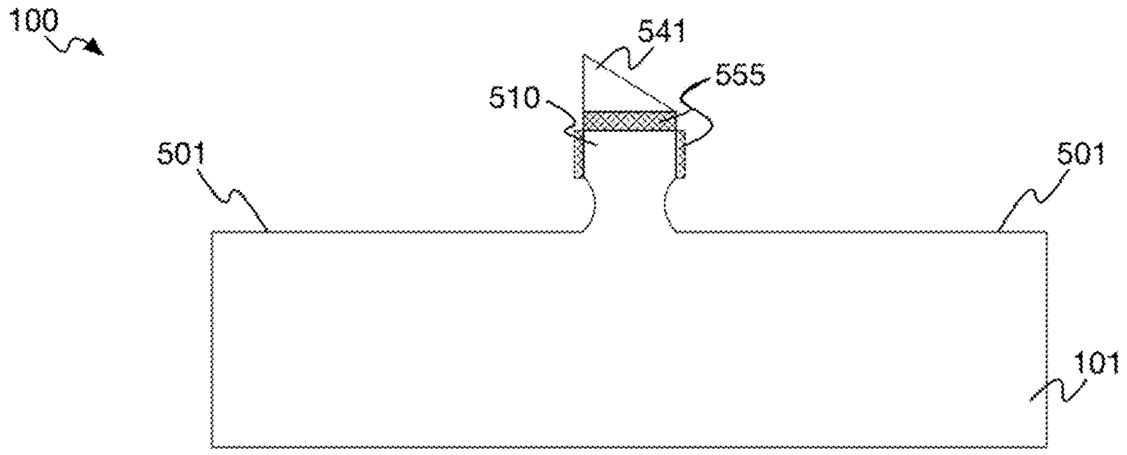
Figure 5H:
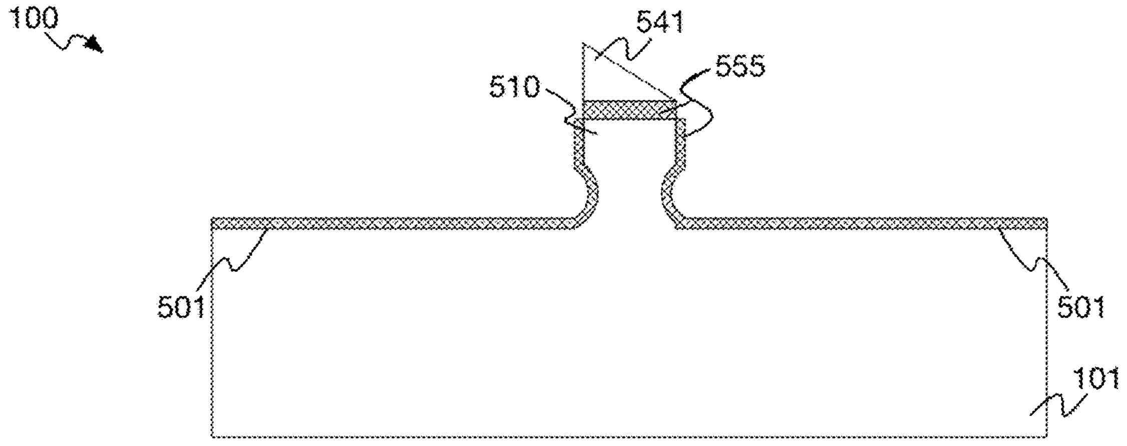
Figure 5I:
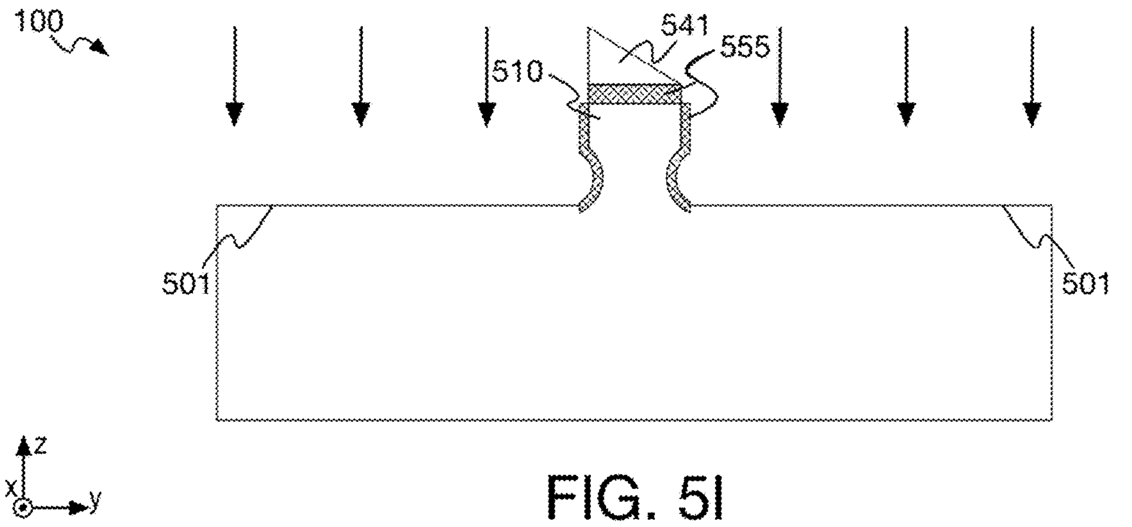
Figure 5J:
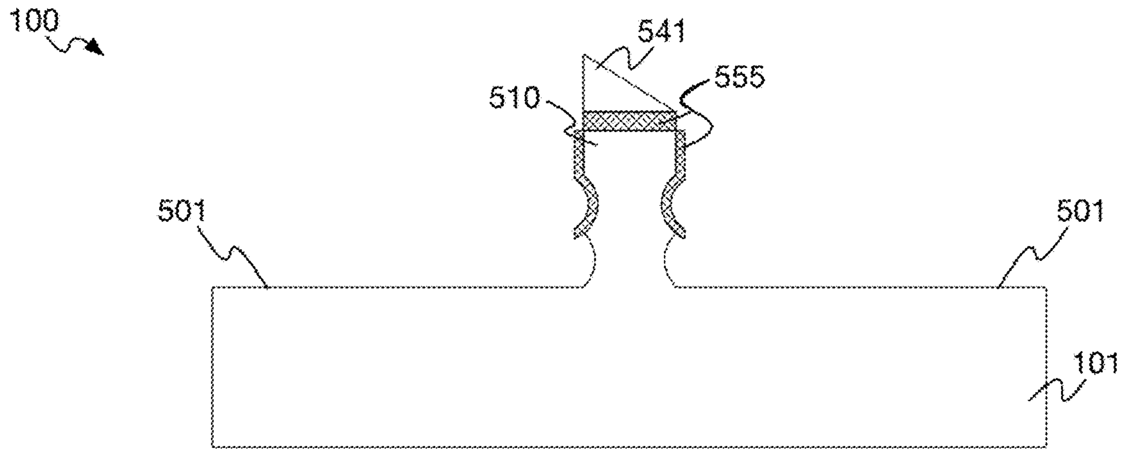
Figure 5K:
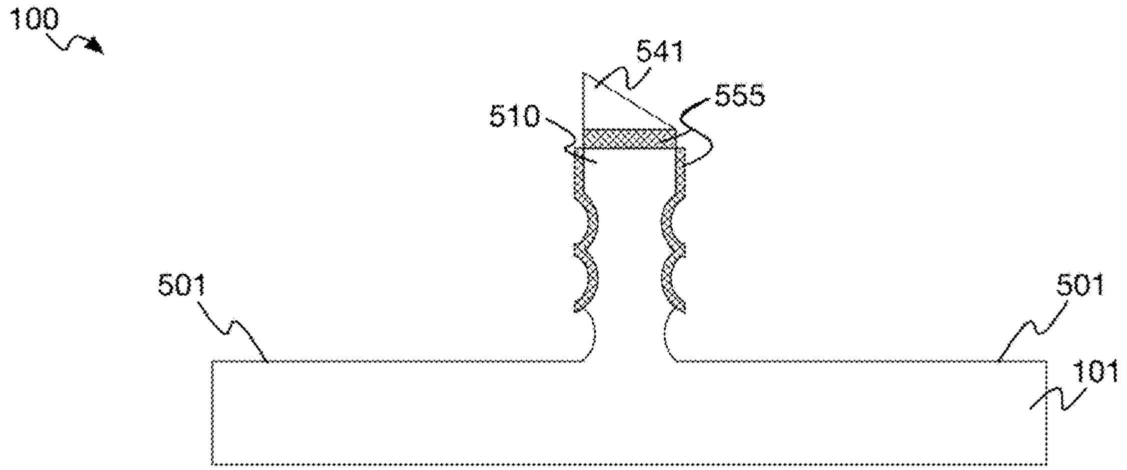
Figure 5L:
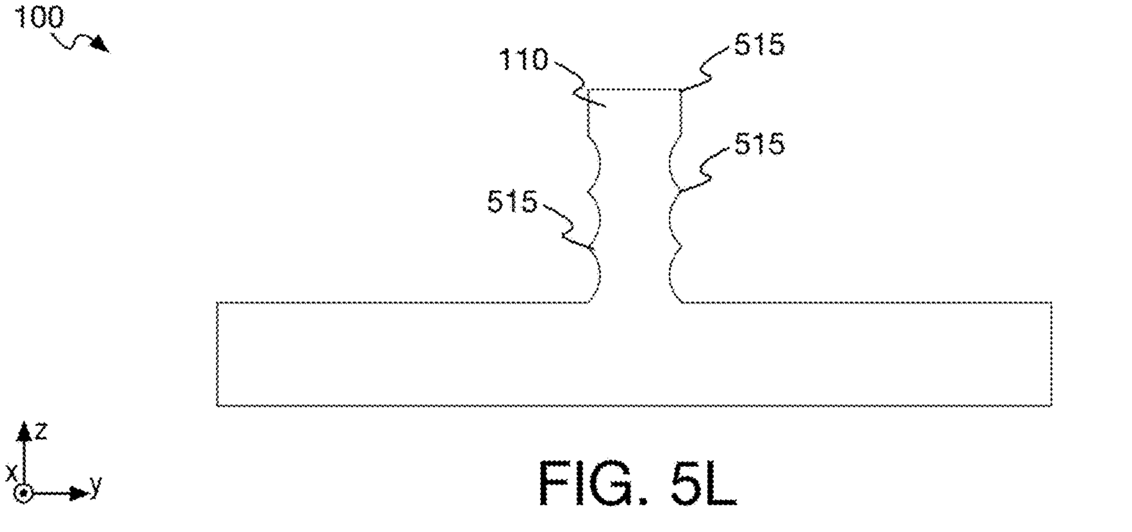
Figure 5M:
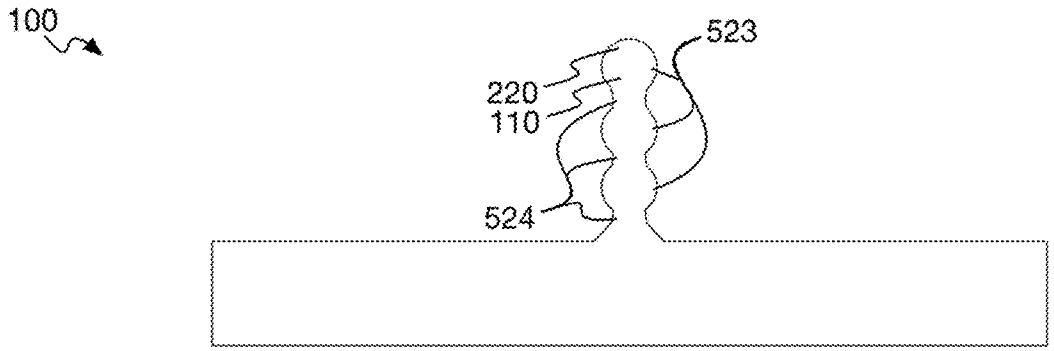
Figure 5N:
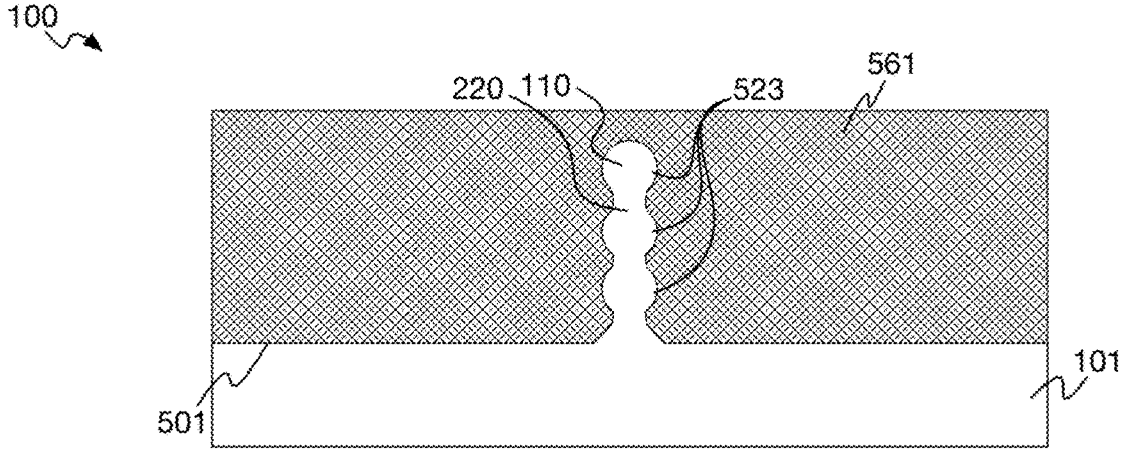
Figure 5O:
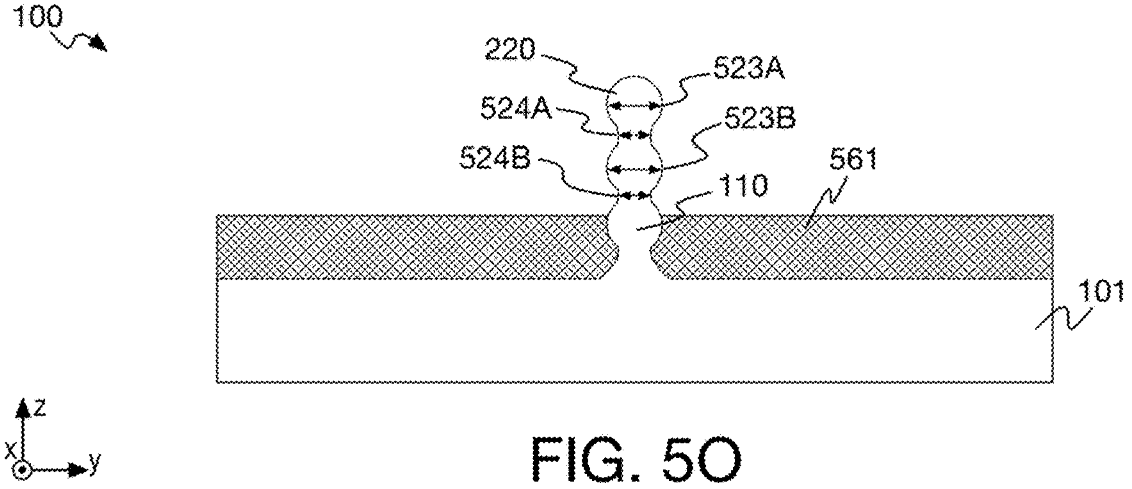
Figure 6:
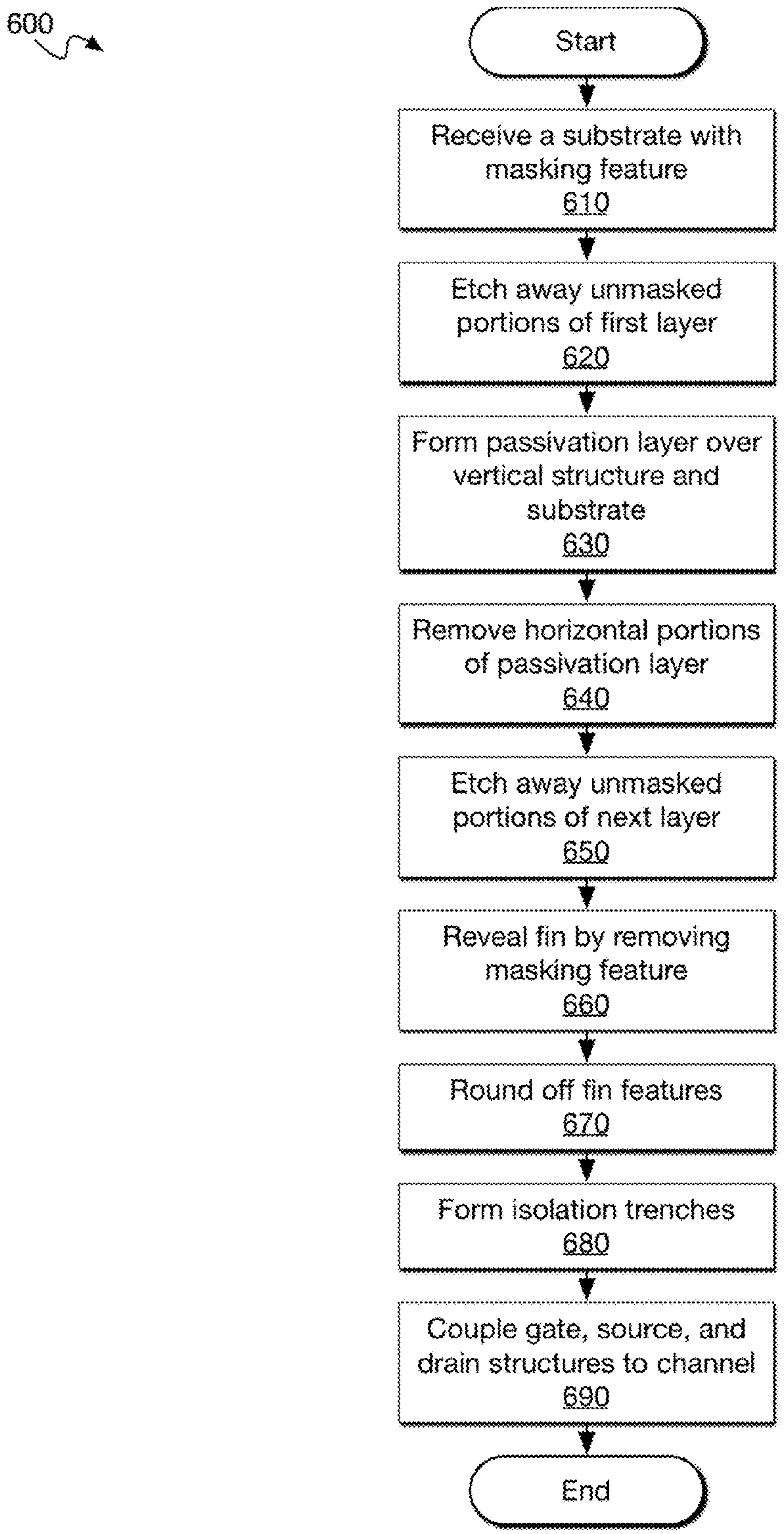
FIG. 6 illustrates various processes or methods for forming non-planar transistors, including vertical fins, from a semiconductor substrate.

FIG. 6 illustrates various processes or methods 600 for forming non-planar transistors, including vertical fins, from a semiconductor substrate, arranged in accordance with at least some implementations of the present disclosure. FIG. 6 shows operations 610, 620, 630, 640, 650, 660, and 670 using a masking, passivating, and etching process. FIG. 6 shows an example sequence, but the operations can be done in other sequences as well. For example, some operations can be done multiple times before other operations are performed at all. The operations include receiving a substrate with a mask feature, etching away a portion of the substrate, passivating any exposed semiconductor material, removing the passivation material from the horizontal surface of the substrate, etching away a layer of semiconductor material from the substrate, revealing a vertical fin by removing the mask feature, and coupling gate, source, and drain structures to the vertical fins as channels. The exemplary structures illustrated in the cross-sectional profile views of FIG. 5 show various operations described in FIG. 6.

FIG. 5A shows substrate 101, in this example in integrated circuit die 100, with one or more layers of masking material 511 formed over backbone feature 140, which has been patterned on substrate 101. In some embodiments, including as shown in FIG. 5A, substrate 101 is covered by an optional layer of passivation layer 555, e.g., an oxide layer, before backbone feature 140 is patterned. In some embodiments, more than one backbone feature 140 is patterned. In some embodiments, tens of thousands or more backbone features 140 are patterned.

Substrate 101 may be one of many layers in integrated circuit die 100. Substrate 101 may be above other layers in integrated circuit die 100 (all or of a portion of which may be subsequently removed in back-side metallization contexts), and other layers may subsequently be formed over substrate 101. Substrate 101 may be below other layers in integrated circuit die 100. Substrate 101 may include any suitable material or materials. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 101 may include silicon having a (100) crystal orientation with a 4°-11° miscut (with 4°-6° being particularly advantageous). Examples using silicon having a crystal orientation of (110) or (111) may offer the advantage of having a smaller mismatch for subsequent epitaxial growth. For example, substrate 101 may be (111) silicon, (100) silicon, or (110) silicon. In an embodiment, substrate 101 includes a (111) crystalline group IV material.

FIG. 5B shows substrate 101 after excess masking material 511 has been removed, exposing an upper horizontal surface 501 of substrate 101 and leaving a pair of sidewall spacers on either side of backbone feature 140, one of which will become a mask feature 541 in this example. Excess passivation layer 555 has been removed as well, leaving a layer only beneath the sidewall spacers, including mask feature 541, and backbone feature 140. Excess material can be removed by, e.g., an anisotropic etch. As is known in the art, various materials can be removed selectively by etchants matched to the materials to be removed. In some embodiments, e.g., when tens of thousands or more backbone features 140 are patterned, tens of thousands or more pairs of sidewall spacers remain alongside tens of thousands or more backbone features 140 over a plane having tens of thousands or more patches of passivation layer 555.

FIG. 5C shows substrate 101 after backbone feature 140 and one of the sidewall spacers have been removed. Excess passivation layer 555 has been removed as well, exposing more of surface 501 and leaving a layer of the optional material only beneath a single remaining sidewall spacer, mask feature 541. Mask feature 541 remains (with passivation layer 555) on a first portion 521 of substrate 101. Mask feature 541 covers first portion 521 but leaves a second portion 522 of substrate 101, in a region adjacent first portion 521, exposed for subsequent etching. In the example shown in FIG. 5C, first portion 521 is separated by dashed lines from second portion 522, which surrounds first portion 521. In some embodiments, e.g., both of a pair of sidewall spacers remain as mask features 541 for forming a pair of eventual fins 110. In some embodiments, e.g., when tens of thousands or more backbone features 140 are patterned, tens of thousands or more pairs of sidewall spacers remain over a plane having tens of thousands or more pairs of patches of passivation layer 555 for forming tens of thousands or more pairs of eventual fins 110. The exemplary structure shown in FIG. 5C is suitable as an example for performing the operations of FIG. 6.

Returning to FIG. 6 and the process described therein, in operation 610 a substrate having a mask feature is received. In some embodiments, more than one mask feature is on the received substrate. In some embodiments, tens of thousands or more mask features are on the received substrate. The structure shown in FIG. 5C, or other structures, can serve as example structures for operation 610 and other operations described in FIG. 6. The semiconductor substrate 101 of FIG. 5C, with mask feature 541, can show how a vertical channel can be formed from the semiconductor material beneath mask feature 541. Although further descriptions of operations may describe the formation of a single channel in a single fin, in some embodiments, tens of thousands or more mask features are used to form tens of thousands or more vertical channels in tens of thousands or more fins. The passivation layer 555 shown in FIG. 5C under mask feature 541 is also compatible with the operations described in FIG. 6.

In operation 620 of FIG. 6, portions of the upper layer of the received substrate are removed, e.g., by an anisotropic etch. The mask feature covers one portion of the upper layer of the substrate but leaves a second portion of the upper layer unmasked and exposed for removal by etching. A portion of the upper layer remains, as does the mask feature over this remaining portion.

FIG. 5D shows an example structure in an example of operation 620 from the process described in FIG. 6. In FIG. 5D, an anisotropic etch removes the top layer of second portion 522 of semiconductor material from substrate 101 while the semiconductor material of first portion 521 under mask feature 541 is protected by mask feature 541 or passivation layer 555. Methods for the well-controlled removal of suitable semiconductor materials, e.g., by anisotropic etches, are well-known to those skilled in the art. The remaining portion of the top layer of semiconductor material from substrate 101 forms a vertical structure that rises above the newly exposed surface 501 of substrate 101. This semiconductor feature 510 will form a vertical channel of a non-planar transistor after subsequent operations. Mask feature 541 and passivation layer 555 also remain after the etch, covering and protecting the top of the emerging semiconductor feature 510.

In operation 630 of FIG. 6, a layer of passivation material is formed over the exposed semiconductor material of substrate, including a substantially vertical layer over the vertical structure from the remaining portion of the layer with a portion removed in operation 620 and a substantially horizontal layer over the upper horizontal surface of the substrate newly exposed by operation 620.

FIG. 5E shows an example structure in an example of operation 630 from the process described in FIG. 6. In FIG. 5E, a layer of passivation layer 555 is formed over the exposed semiconductor material of substrate 101. A substantially horizontal layer of passivation layer 555 now covers the upper horizontal surface 501 of substrate 101 previously exposed by operation 620. A substantially vertical layer of passivation layer 555 covers the vertical surfaces of the semiconductor feature 510 emerging from substrate 101, rising above the upper horizontal surface 501 of substrate 101. Mask feature 541 and passivation layer 555 also remain, covering and protecting the top of the emerging semiconductor feature 510.

In operation 640 of FIG. 6, the horizontal layer of passivation material is removed, e.g., by an anisotropic etch, exposing the upper horizontal surface of the semiconductor material substrate. The vertical layer of passivation material is preserved to protect the emerging vertical semiconductor structure (which rises above the upper horizontal surface of the semiconductor substrate) from a subsequent removal operation.

FIG. 5F shows an example structure in an example of operation 640 from the process described in FIG. 6. In FIG. 5F, the horizontal layer of passivation layer 555 not under mask feature 541 is removed by an anisotropic etch, again exposing horizontal surface 501. The vertical layer of passivation layer 555 is preserved to protect the sides of the emerging semiconductor feature 510 from a subsequent removal operation. Mask feature 541 and passivation layer 555 also remain, covering and protecting the top of the emerging semiconductor feature 510.

In operation 650 of FIG. 6, a portion of the uppermost layer of the semiconductor material substrate (but not as high as the top of the emerging vertical semiconductor structure) is etched away. The uppermost horizontal surface was left exposed after the horizontal layer of passivation material was removed in operation 640.

FIG. 5G shows an example structure in an example of operation 650 from the process described in FIG. 6. In FIG. 5G, the emerging semiconductor feature 510 is a layer taller as another layer of semiconductor material has been removed from substrate 101. The second layer of substrate 101 has been removed by isotropic etch, exposing a new, further recessed horizontal surface 501 of substrate 101. Mask feature 541 and passivation layer 555 remain, covering and protecting the top of the emerging semiconductor feature 510, but the new layer of the emerging semiconductor feature 510 shows an undercut profile, indicating the isotropic nature of the latest etch. The isotropic etch allows for further narrowing of the emerging semiconductor feature 510. The undercut profile, where a rounded-out portion of the emerging semiconductor feature 510 has been removed and left a lesser width, will lead to one or more necks in the semiconductor feature 510 and the eventual beaded appearance of fin 110.

Operations 630, 640, and 650 of FIG. 6 can optionally be repeated together to grow semiconductor feature 510 yet taller. Each iteration will add a layer to semiconductor feature 510 of FIG. 5 by removing a layer from substrate 101. Each iteration leaves another neck in semiconductor feature 510 where an undercutting, isotropic etch results in a narrowed width of semiconductor feature 510. This is shown in FIGS. 5H, 5I, 5J, and 5K.

FIG. 5H shows an example structure in an example of repeating operation 630 from the process described in FIG. 6. In FIG. 5H, a layer of passivation layer 555 is formed over the exposed semiconductor material of substrate 101. A substantially horizontal layer of passivation layer 555 covers the upper horizontal surface 501 of substrate 101 previously exposed by a first performance of operation 650. A somewhat vertical layer of passivation layer 555 covers the surfaces of the semiconductor feature 510 "grown" from substrate 101, both the uppermost portion directly below mask feature 541 and the first layer of passivation layer 555, as well as the narrowed, neck portion showing the isotropic etch of a first performance of operation 650. Mask feature 541 and passivation layer 555 also remain, covering and protecting the top of semiconductor feature 510.

FIG. 5I shows an example structure in an example of repeating operation 640 from the process described in FIG. 6. In FIG. 5I, the horizontal layer of passivation layer 555 not under mask feature 541 is removed by an anisotropic etch, again exposing horizontal surface 501. The somewhat vertical layer of passivation layer 555 is preserved to protect the sides of semiconductor feature 510 from a subsequent etch operation. Mask feature 541 and passivation layer 555 also remain, covering and protecting the top of semiconductor feature 510.

FIG. 5J shows an example structure in an example of repeating operation 650 from the process described in FIG. 6. In FIG. 5J, semiconductor feature 510 is a layer taller as a third layer of semiconductor material has been removed from substrate 101 to expose a new, further recessed horizontal surface 501, the second and third layers of substrate 101 having been removed by isotropic etch. Mask feature 541 and passivation layer 555 remain, covering and protecting the top of the emerging semiconductor feature 510, but the newest layer of semiconductor feature 510 shows an undercut profile, indicating the isotropic nature of the latest etch. The undercut profile is repeated and has left another narrower width, another neck, in semiconductor feature 510 and will add another "bead" to the eventual beaded appearance of fin 110. Semiconductor feature 510 is three layers tall with two necks from isotropic etches.

FIG. 5K shows an example structure in an example of repeating another iteration of operation 630, 640, and 650 from the process described in FIG. 6. In FIG. 5K, semiconductor feature 510 is a layer taller as a fourth layer of semiconductor material has been removed from substrate 101, the second, third, and fourth layers of substrate 101 having been removed by isotropic etch to expose a new horizontal surface 501, recessed yet further. Semiconductor feature 510 is now four layers tall with three necks from isotropic etches. Mask feature 541 and passivation layer 555 remain, covering the top of the emerging semiconductor feature 510.

In operation 660 of FIG. 6, the fin is revealed by removing, e.g., by an anisotropic etch, the mask feature and the passivation material (both the somewhat vertical portion and any optional horizontal portion under the mask feature). The removing of the mask feature and the passivation material also reveals a channel portion of the fin. In some embodiments, the fin is rounded off by an etch that removes the mask feature and the passivation material.

FIG. 5L shows an example structure in an example of operation 660 from the process described in FIG. 6. In FIG. 5L, fin 110 is revealed from semiconductor feature 510 by removing, e.g., by an anisotropic etch, mask feature 541 and passivation layer 555 (both the somewhat vertical portion and any optional horizontal portion under mask feature 541). In the example of FIG. 5L, mask feature 541 and passivation layer 555 were selectively removed, and fin 110 still shows relatively abrupt protrusions 515, features in the semiconductor material that were previously masked by mask feature 541 or passivation layer 555. Protrusions 515 include, e.g., corners on the top of fin 110 and abrupt meetings of the undercut etches on sides of fin 110. In some embodiments, any of the relatively abrupt protrusions 515 of fin 110 are rounded off by an etch that removes mask feature 541 and passivation layer 555.

In optional operation 670 of FIG. 6, the fin is rounded down, i.e. smoothed. The relatively abrupt protrusions of the fin are smoothed or rounded down, e.g., by an isotropic etch or any suitable method. In some embodiments, a rounding down of the relatively abrupt protrusions of the fin is done by an etch, which simultaneously removes the mask feature and the passivation material (both the somewhat vertical portion and any optional horizontal portion under the mask feature). In some embodiments, an oxidizing operation is performed on the exposed, outer surface of the fin, which rounds down the relatively abrupt protrusions of the fin, and then the oxide is stripped off of the remaining, smoothed fin.

FIG. 5M shows an example structure in an example of optional operation 670 of the process described in FIG. 6. In FIG. 5M, the relatively abrupt protrusions of fin 110 (and channel portion 220) have been rounded down by an isotropic etch. In some embodiments, an etch smooths the relatively abrupt protrusions of fin 110 and simultaneously removes mask feature 541 and passivation layer 555.

Having been rounded down, fin 110 has a beaded appearance. The three bead portions 523 are rounded (convex) and wider than two narrower neck portions 524 between and below bead portions 523. Narrower neck portions 524 are the result of the narrowing, undercutting etches of operation 650. Bead portions 523 are the resultant portions where the wider, formerly abrupt meetings of the undercut etches have been rounded over.

In optional operation 680 of FIG. 6, isolation dielectric is formed around the fin by forming one or more layers of electrically insulating material over the substrate and around the fin. Insulating material can first be laid down, e.g., deposited, around and over the fin and planarized. Planarization allows for the layers of electrically insulating material to subsequently be uniformly recessed down, e.g., by an etch, to expose a portion of the fin and to leave a substantially planar surface around buried subfin portions of the fin for further processing.

FIG. 5N shows an example structure as part of an example of optional operation 680 of the process described in FIG. 6. In FIG. 5N, one or more relatively thick layers of an insulating material 561 is formed over upper horizontal surface 501 of substrate 101 and over and around channel portion 220 of fin 110. All three bead portions 523 are covered by insulating material 561, which is planarized. In some embodiments, insulating material 561 is the same material used for passivation layer 555 in other operations. In some embodiments, insulating material 561 includes oxygen. In some embodiments, the one or more relatively thick layers of insulating material 561 include a thermally grown oxide, which is also used previously for passivation layer 555. The one or more relatively thick layers of insulating material 561 can be planarized to allow for subsequent removal operations, e.g., etching, to result in similarly planar top surfaces.

FIG. 5O shows an example structure as part of an example of optional operation 680 of the process described in FIG. 6. In FIG. 5O, the one or more relatively thick layers of an insulating material 561, previously formed and planarized, are recessed down to expose channel portion 220 of fin 110, e.g., to allow for the coupling of a gate structure. The remaining insulating material 561 can serve as an isolation trench by electrically isolating fin 110 from other structures, such as other fins 110. A portion of fin 110, below the exposed channel portion 220, is below the level of insulating material 561.

The cross-section of exposed fin 110 shows a beaded appearance with wider bead portions 523 connected by neck portions 524 with narrower widths. For example, going upwards along channel portion 220 of fin 110 from the planarized insulating material 561, there are two fully exposed bead portions 523A, 523B and neck portion 524A between them. Bead and neck widths are shown by horizontal, double-headed arrows. Lower bead portion 523B is at a first height with a width greater than neck portion 524A at a second height above it, and top bead portion 523A (also with a width greater than neck portion 524A below it) is at a third height. Another neck portion 524B below lower bead portion 523B also has a width less than those of bead portions 523A, 523B.

In operation 690 of FIG. 6, the revealed channel portion of the fin is coupled to a source, drain, and gate structure. Except that fins formed by process 600 would have a beaded appearance (as seen in FIG. 5O), the gate structure, source, and drain might look similar to the example of FIG. 3B, which has four trapezoidal fins. In some embodiments, tens of thousands or more vertical channels are formed in tens of thousands or more vertical fins. Vertical fins can each provide a channel for separate transistors, or multiple vertical fins can be used in a single transistor. Source structures can be formed from, grown on, or connected to channels in the fins. Drain structures can be formed from, grown on, or connected to channels in the fins. Vertical fins can each provide a channel coupled to separate gate structures, or multiple vertical fins can be used in a single transistor, e.g., coupled to a single gate structure.

As discussed, very low-temperature operation provides advantages for non-planar transistors inclusive of increased carrier mobility and reduced leakage and contact resistance. In some embodiments, integrated circuit dies with narrow-channel, non-planar transistors are thermally coupled to active-cooling structures. A number of structures may be used to lower the system temperature, which can synergistically enhance the benefits sought in forming narrow, vertical fins as channels for non-planar transistors and in some specific embodiments where integrated circuit die is to be actively cooled to very low temperatures. Active-cooling structures can be used to lower system temperatures to below ambient temperature, even to well below ambient temperature. Active-cooling structures can include thermoelectric coolers. In some embodiments, active-cooling structures include stacks of alternating p- and n-type semiconductor materials. In some embodiments, active-cooling structures flow cooling fluids through channels, including microchannels, thermally coupled to integrated circuit packages. In some embodiments, active-cooling structures include channels thermally coupled to integrated circuit dies. In some embodiments, active-cooling structures include channels on one or more sides of integrated circuit dies. In some embodiments, active-cooling structures include channels within integrated circuit dies. In some embodiments, active-cooling structures include two-phase cooling. In some embodiments, active-cooling structures include low-boiling-point fluids. In some embodiments, active-cooling structures include refrigerants as cooling fluids.

Figure 7:
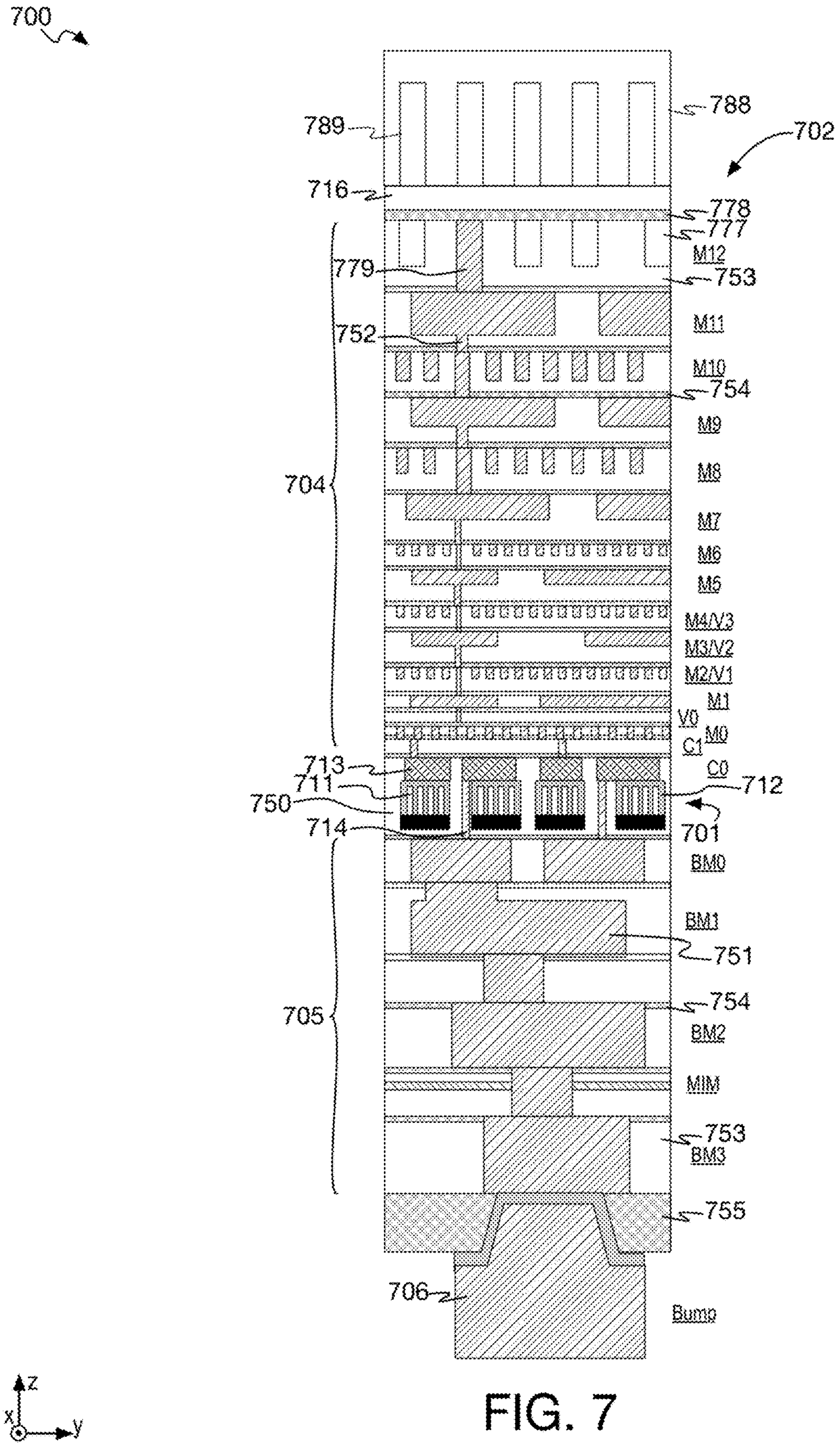
FIG. 7 illustrates a cross-sectional view of a low-temperature, integrated circuit system using die-level and package-level cooling.

FIG. 7 illustrates a cross-sectional view of a low-temperature, integrated circuit system 700 using die-level and package-level active cooling, arranged in accordance with at least some implementations of the present disclosure. In the example of integrated circuit system 700, integrated circuit die 702 includes active-cooling structures or components as provided by both die-level microchannels 777 and package-level active-cooling structure 788. Integrated circuit system 700 includes a lateral surface along the x-y plane that may be defined or taken at any vertical position of integrated circuit system 700. The lateral surface of the x-y plane is orthogonal to a vertical or build-up dimension as defined by the z-axis. In some embodiments, integrated circuit system 700 may be formed from any substrate material suitable for the fabrication of transistor circuitry. In some embodiments, a semiconductor substrate is used to manufacture transistors 701 and other components of integrated circuit system 700. The semiconductor substrate may include a wafer or other piece of silicon or another semiconductor material. Suitable semiconductor substrates include, but are not limited to, single crystal silicon, poly crystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 7, integrated circuit system 700 includes an integrated circuit die 702, which is a monolithic integrated circuit including non-planar transistors 701, front-side metallization layers 704 (or front-side interconnect layers), and optional back-side metallization layers 705 (or back-side interconnect layers). As shown, transistors 701 are non-planar transistors embedded within a dielectric layer 750. As shown, each of non-planar transistors 701 include channel portions 711, gate structures 712, and gate contacts 713. Each of non-planar transistors 701 also include source and drain structures, and source and drain contacts, which are not shown in the cross-section of FIG. 7. In some embodiments, front-side metallization layers 704 provide signal routing to non-planar transistors 701 and back-side metallization layers 705 provide power delivery, as enabled by through-contacts 714, to non-planar transistors 701. In some embodiments, integrated circuit system 700 further includes a package-level cooling structure 788, which may be deployed on or over front-side metallization layers 704 (as shown) or on or over a back-side of integrated circuit die 702. In some embodiments, package-level cooling structure 788 is coupled to integrated circuit die 702 by an adhesion layer 716. Integrated circuit system 700 may also be deployed without back-side metallization layers 705 shown in FIG. 7. In such embodiments, signal routing and power are provided to transistors 701 via front-side metallization layers 704. However, use of back-side metallization layers 705 may offer advantages.

Interconnectivity of transistors 701, signal routing to and from transistors 701, power delivery to transistors 701, and routing to an outside device (not shown), is provided by front-side metallization layers 704, optional back-side metallization layers 705, and package-level interconnects 706. In the example of FIG. 7, package-level interconnects 706 are provided on or over a back-side of integrated circuit die 702 as bumps over a passivation layer 755. However, package-level interconnects 706 may be provided using any suitable interconnect structures such as bond pads, solder bumps, etc. Furthermore, in some embodiments, package-level interconnects 706 are provided on or over a front-side of integrated circuit die 702 (i.e., over front-side metallization layers 704) and package-level cooling structure 788 is provided on or over a back-side of integrated circuit die 702 (i.e., adjacent transistors 701).

In integrated circuit system 700, integrated circuit die 702 includes die-level, active-cooling as provided by die-level microchannels 777. Die-level microchannels 777 are to convey a heat transfer fluid therein to remove heat from integrated circuit die 702. The heat transfer fluid may be any suitable liquid or gas. In some embodiments, the heat transfer fluid is liquid nitrogen operable to lower the temperature of integrated circuit die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 777 may be provided in any pattern in the x-y plane such as serpentine patterns, patterns of multiple parallel die-level microchannels 777, or the like. Die-level microchannels 777 couple to a heat exchanger (not shown) that removes heat from and cools the heat transfer fluid before re-introduction to die-level microchannels 777. The flow of fluid within die-level microchannels 777 may be provided by a pump or other fluid flow device. The operation of the heat exchanger, pump, etc. may be controlled by a controller.

In the illustrated embodiment, die-level microchannels 777 are implemented at metallization level M12. In other embodiments, die-level microchannels 777 are implemented over metallization level M12. Die-level microchannels 777 may be formed using any suitable technique or techniques such as patterning and etch techniques to form the void structures of die-level microchannels 777 and passivation or deposition techniques to form a cover structure 778 to enclose the void structures. As shown, in some embodiments, the die-level, active-cooling structure of integrated circuit system 700 includes a number of die-level microchannels 777 in integrated circuit die 702 and over a number of front-side metallization layers 704. As discussed, die-level microchannels 777 are to convey a heat transfer fluid therein. In some embodiments, a metallization feature 779 of metallization layer M12 is laterally adjacent to die-level microchannels 777. For example, metallization feature 779 may couple to a package-level interconnect structure (not shown) for signal routing for integrated circuit die 702. In some embodiments, a passive heat removal device such as a heat sink or the like may be used instead of or in addition to package-level cooling structure 788. In some embodiments, package-level cooling structure 788 is not deployed in integrated circuit system 700.

As used herein, the term "metallization layer" describes layers with interconnections or wires that provide electrical routing, whether formed of metal or other material, including, e.g., graphene. Adjacent metallization layers may be formed of different materials and by different methods. Adjacent metallization layers, such as metallization interconnects 751, are interconnected by vias, such as vias 752, that may be characterized as part of the metallization layers or between the metallization layers. As shown, in some embodiments, front-side metallization layers 704 are formed over and immediately adjacent transistors 701. As used herein, the terms "front-side" and "back-side" are based on the build-up direction of integrated circuit die 702 with the front-side being the side exposed during processing of the substrate used to fabricate transistors 701. The back-side is then the opposite side, which may be exposed during processing by attaching the front-side to a carrier wafer and exposing the back-side (e.g., by back-side grind or etch operations) as known in the art.

In the illustrated example, front-side metallization layers 704 include M0, V0, M1, M2/V1, M3/V2, M4/V3, and M4-M12. However, front-side metallization layers 704 may include any number of metallization layers such as eight or more metallization layers. Similarly, back-side metallization layers 705 include BM0, BM1, BM2, and BM3. However, back-side metallization layers 705 may include any number of metallization layers such as two to five metallization layers. Front-side metallization layers 704 and back-side metallization layers 705 are embedded within dielectric materials 753, 754. Furthermore, optional metal-insulator-metal (MIM) devices such as diode devices may be provided within back-side metallization layers 705. Other devices such as capacitive memory devices may be provided within front-side metallization layers 704 and/or back-side metallization layers 705.

Integrated circuit system 700 includes package-level active-cooling structure 788 having package-level microchannels 789. Package-level microchannels 789 are to convey a heat transfer fluid therein to remove heat from integrated circuit die 702. The heat transfer fluid may be any suitable liquid or gas as discussed with respect to die-level microchannels 777. Package-level microchannels 789 may be provided in any pattern in the x-y plane such as serpentine patterns, patterns of multiple parallel package-level microchannels 789, etc. Package-level microchannels 789 couple to a heat exchanger (not shown) that removes heat from and cools the heat transfer fluid before re-introduction to package-level microchannels 789. The flow of fluid within package-level microchannels 789 may be provided by a pump or other fluid-flow device. The operation of the heat exchanger, pump, etc. may be controlled by a controller. In the illustrated embodiment, package-level active-cooling structure 788 is a chiller mounted to integrated circuit die 702 such that the chiller has a solid body having microchannels therein to convey a heat transfer fluid.

In some embodiments, the heat-removal fluid deployed in die-level microchannels 777 and package-level active-cooling structure 788 are coupled to the same pump and heat exchanger systems. In such embodiments, the heat removal fluid conveyed in both die-level microchannels 777 and package-level active-cooling structure 788 are the same material. Such embodiments may advantageously provide simplicity. In other embodiments, the heat removal fluids are controlled separately. In such embodiments, the heat removal fluids conveyed by die-level microchannels 777 and package-level active-cooling structure 788 may be the same or they may be different. Such embodiments may advantageously provide improved flexibility.

As discussed, integrated circuit system 700 includes integrated circuit die 702 and optional die-level and package-level active-cooling structures operable to remove heat from integrated circuit die 702 to achieve a very low operating temperature of integrated circuit die 702. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active-cooling structure may be provided as a package-level structure (i.e., separable from integrated circuit die 702), as a die-level structure (i.e., integral to integrated circuit die 702), or both. In some embodiments, integrated circuit die 702 is deployed in a cold environment, formed using sufficiently conductive materials, etc. and an active-cooling structure is not used.

Figure 8:
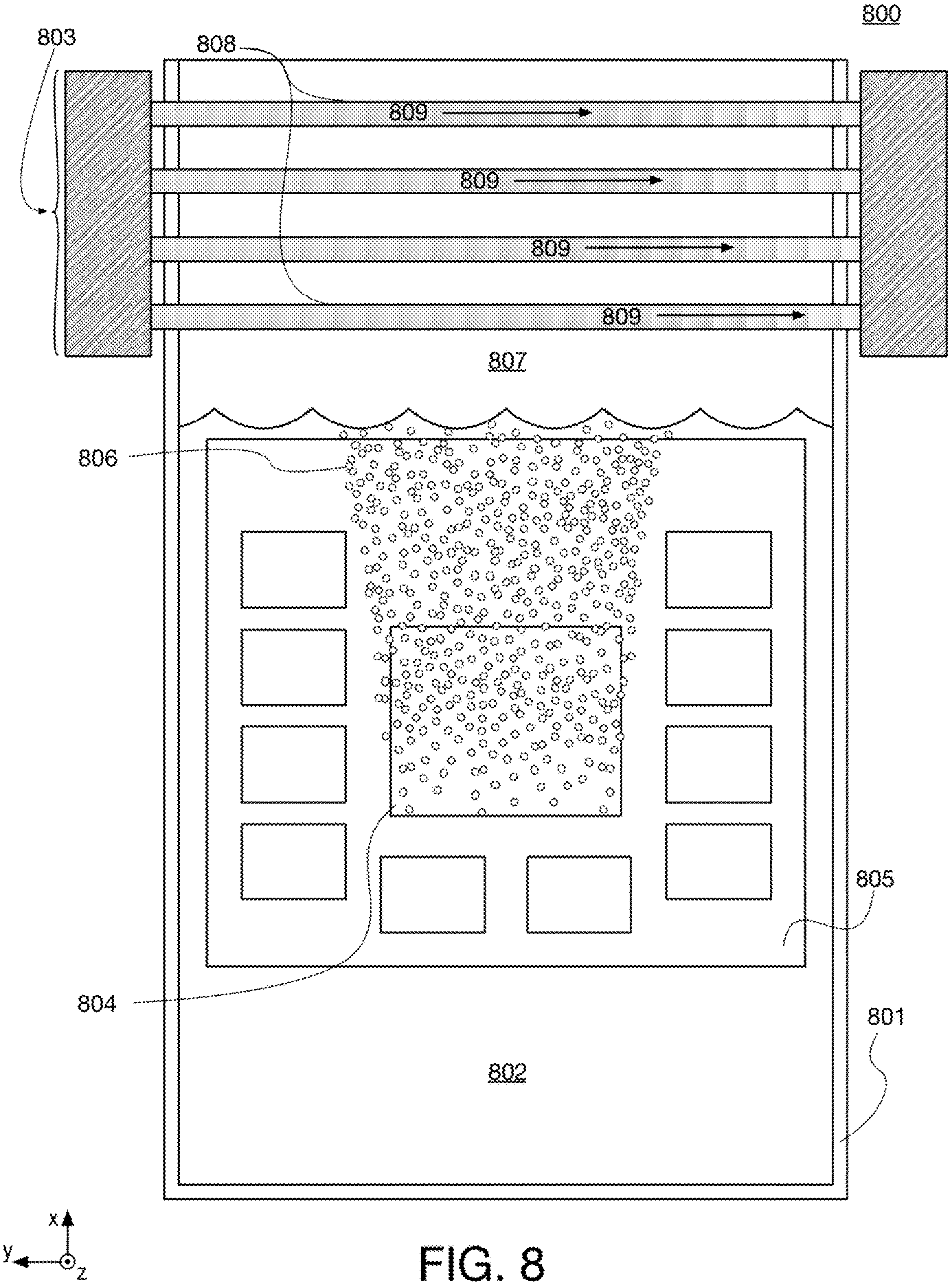
FIG. 8 illustrates a view of an example two-phase immersion cooling system for low-temperature operation of an integrated circuit die.

FIG. 8 illustrates a view of an example two-phase immersion cooling system 800 for low-temperature operation of an integrated circuit die, arranged in accordance with at least some implementations of the present disclosure. As shown, two-phase immersion cooling system 800 includes a fluid containment structure 801, a low-boiling point liquid 802 within fluid containment structure 801, and a condensation structure 803 at least partially within fluid containment structure 801. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 804, such as an integrated circuit package including any of integrated circuit dies or systems 100, 700 as discussed herein is immersed in low-boiling point liquid 802. In some embodiments, integrated circuit dies or systems 100, 700 as deployed in two-phase immersion cooling system 800 do not include additional active cooling structures, although such die level or package level active cooling structures may be used in concert with two-phase immersion cooling system 800. In some embodiments, when deployed in two-phase immersion cooling system 800, package-level active-cooling structure 788 is a heat sink, a heat dissipation plate, a porous heat dissipation plate or the like.

Notably, integrated circuit die 702 (or integrated circuit die 100), is the source of heat in the context of two-phase immersion cooling system 800. For example, integrated circuit die 702 may be packaged and mounted on electronics substrate 805. Electronic substrate 805 may be coupled to a power supply (not shown) and may be partially or completely submerged in low-boiling point liquid 802.

In operation, the heat produced by heat generation source 804 vaporizes low-boiling point liquid 802 as shown in vapor or gas state as bubbles 806, which may collect, due to gravitational forces, above low-boiling point liquid 802 as a vapor portion 807 within fluid containment structure 801. Condensation structure 803 may extend through vapor portion 807. In some embodiments, condensation structure 803 is a heat exchanger having a number of tubes 808 with a cooling fluid (i.e., a fluid colder than the condensation point of vapor portion 807) shown by arrows 809 that may flow through tubes 808 to condense vapor portion 807 back to low-boiling point liquid 802. In the integrated circuit system of FIG. 8, package-level active-cooling structure 788 includes a passive cooling structure such as a heat sink for immersion in low-boiling point liquid 802.

Figure 9:
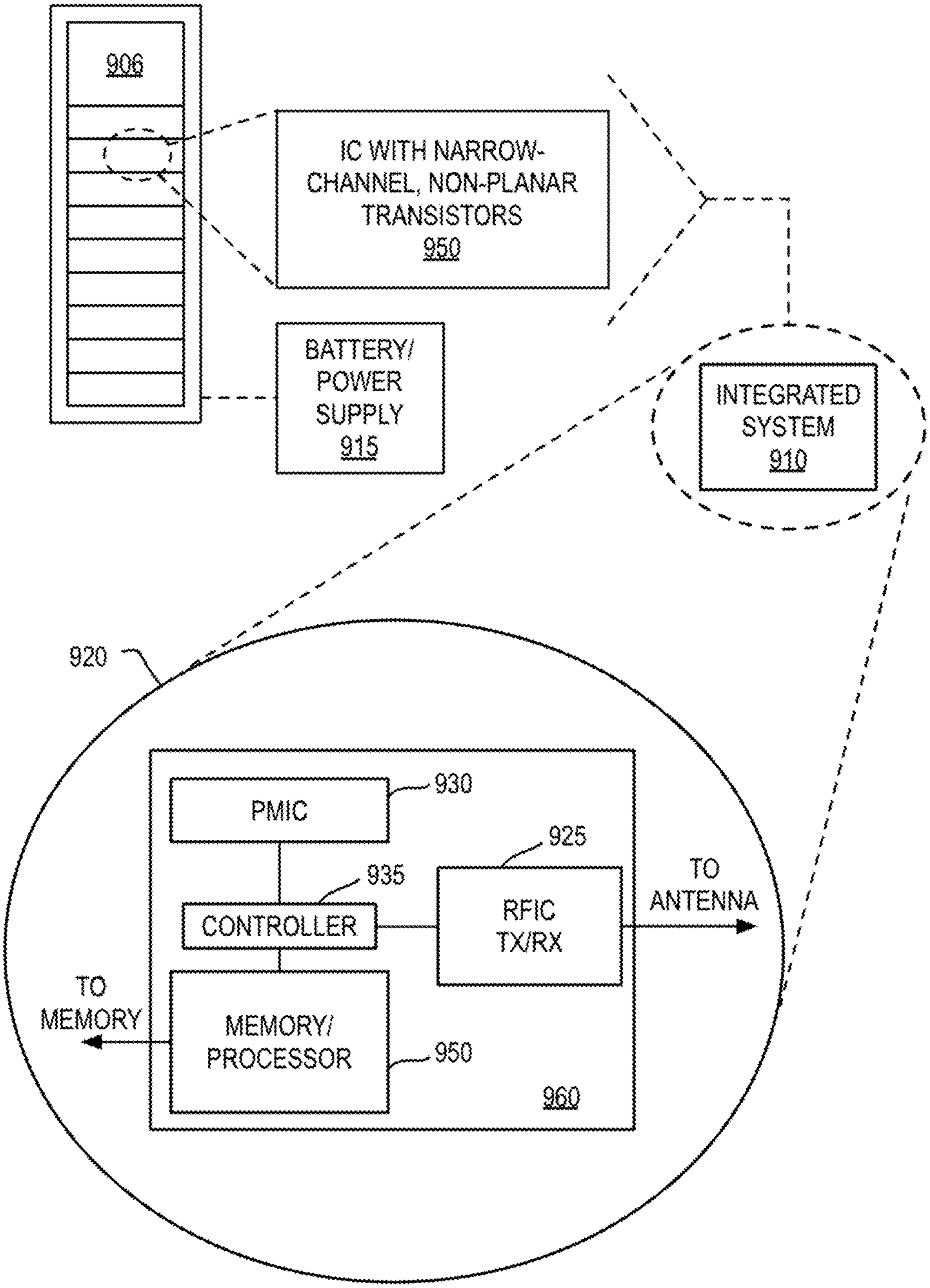
FIG. 9 illustrates a diagram of an example data server machine employing integrated circuit dies with narrow-channel, non-planar transistors.

FIG. 9 illustrates a diagram of an example data server machine 906 employing integrated circuit dies with narrow-channel, non-planar transistors, arranged in accordance with at least some implementations of the present disclosure. Server machine 906 may be any commercial server, for example, including any number of high-performance computing platforms disposed within a rack and networked together for electronic data processing, which in the exemplary embodiment includes one or more devices 950 having an integrated circuit with narrow-channel, non-planar transistors. In some embodiments, example data server machine 906 has low-temperature, active-cooling operable to remove heat from the integrated circuit to achieve any low operating temperature discussed herein.

Also as shown, server machine 906 includes a battery and/or power supply 915 to provide power to devices 950, and to provide, in some embodiments, power delivery functions such as power regulation. Devices 950 may be deployed as part of a package-level integrated system 910. Integrated system 910 is further illustrated in the expanded view 920. In the exemplary embodiment, devices 950 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 950 is a microprocessor including an SRAM cache memory. As shown, device 950 may employ a die or device having any narrow-channel, non-planar transistors and/or related characteristics discussed herein. Device 950 may be further coupled to (e.g., communicatively coupled to) a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935 thereof.

Figure 10:
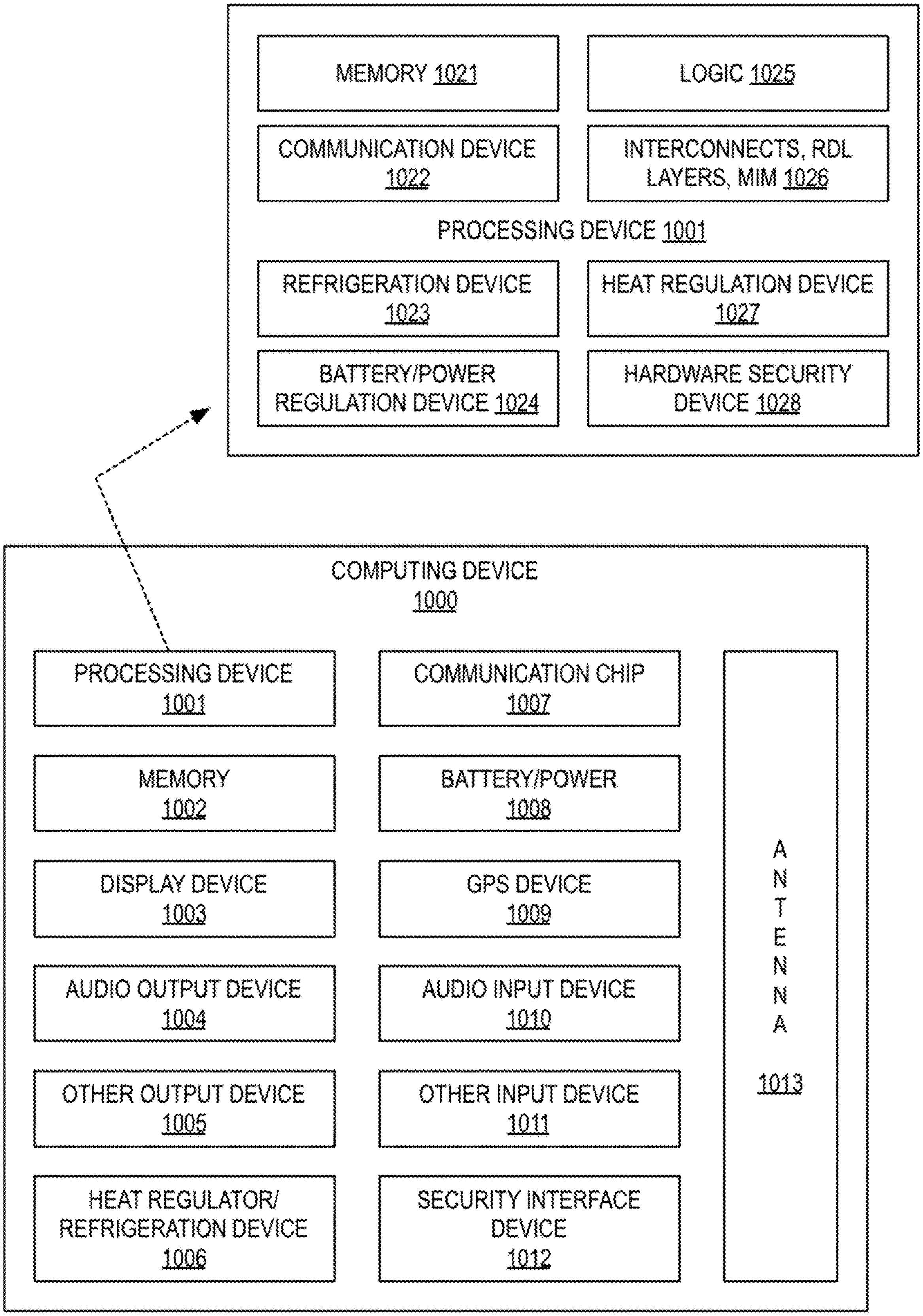
FIG. 10 is a block diagram of an example computing device, all arranged in accordance with at least some implementations of the present disclosure.

FIG. 10 is a block diagram of an example computing device 1000, arranged in accordance with at least some implementations of the present disclosure. For example, one or more components of computing device 1000 may include any of the devices or structures discussed herein. A number of components are illustrated in FIG. 10 as being included in computing device 1000, but any one or more of these components may be omitted or duplicated, as suitable for the application. In some embodiments, some or all of the components included in computing device 1000 may be attached to one or more printed circuit boards (e.g., a motherboard). In some embodiments, various ones of these components may be fabricated onto a single system-on-a-chip (SoC) die. Additionally, in various embodiments, computing device 1000 may not include one or more of the components illustrated in FIG. 10, but computing device 1000 may include interface circuitry for coupling to the one or more components. For example, computing device 1000 may not include a display device 1003, but may include display device interface circuitry (e.g., a connector and driver circuitry) to which display device 1003 may be coupled. In another set of examples, computing device 1000 may not include an audio output device 1004, other output device 1005, global positioning system (GPS) device 1009, audio input device 1010, or other input device 1011, but may include audio output device interface circuitry, other output device interface circuitry, GPS device interface circuitry, audio input device interface circuitry, audio input device interface circuitry, to which audio output device 1004, other output device 1005, GPS device 1009, audio input device 1010, or other input device 1011 may be coupled.

Computing device 1000 may include a processing device 1001 (e.g., one or more processing devices). As used herein, the term "processing device" or "processor" indicates a device that processes electronic data from registers and/or memory to transform that electronic data into other electronic data that may be stored in registers and/or memory. Processing device 1001 may include a memory 1021, a communication device 1022, a refrigeration device 1023, a battery/power regulation device 1024, logic 1025, interconnects 1026 (i.e., optionally including redistribution layers (RDL) or metal-insulator-metal (MIM) devices), a heat regulation device 1027, and a hardware security device 1028.

Processing device 1001 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1000 may include a memory 1002, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1002 includes memory that shares a die with processing device 1001. This memory may be used as cache memory and may include embedded dynamic random-access memory (eDRAM) or spin transfer torque magnetic random-access memory (STT-M RAM).

Computing device 1000 may include a heat regulation/refrigeration device 1006. Heat regulation/refrigeration device 1006 may maintain processing device 1001 (and/or other components of computing device 1000) at a predetermined low temperature during operation. This predetermined low temperature may be any temperature discussed herein.

In some embodiments, computing device 1000 may include a communication chip 1007 (e.g., one or more communication chips). For example, the communication chip 1007 may be configured for managing wireless communications for the transfer of data to and from computing device 1000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1007 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1007 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1007 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1007 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1007 may operate in accordance with other wireless protocols in other embodiments. Computing device 1000 may include an antenna 1013 to facilitate wireless communications and/or to receive other wireless communications (such as AM or FM radio transmissions).

In some embodiments, communication chip 1007 may manage wired communications, such as electrical, optical, or any other suitable communication protocols (e.g., the Ethernet). As noted above, communication chip 1007 may include multiple communication chips. For instance, a first communication chip 1007 may be dedicated to shorter-range wireless communications such as Wi-Fi or Bluetooth, and a second communication chip 1007 may be dedicated to longer-range wireless communications such as GPS, EDGE, GPRS, CDMA, WiMAX, LTE, EV-DO, or others. In some embodiments, a first communication chip 1007 may be dedicated to wireless communications, and a second communication chip 1007 may be dedicated to wired communications.

Computing device 1000 may include battery/power circuitry 1008. Battery/power circuitry 1008 may include one or more energy storage devices (e.g., batteries or capacitors) and/or circuitry for coupling components of computing device 1000 to an energy source separate from computing device 1000 (e.g., AC line power).

Computing device 1000 may include a display device 1003 (or corresponding interface circuitry, as discussed above). Display device 1003 may include any visual indicators, such as a heads-up display, a computer monitor, a projector, a touchscreen display, a liquid crystal display (LCD), a light-emitting diode display, or a flat panel display, for example.

Computing device 1000 may include an audio output device 1004 (or corresponding interface circuitry, as discussed above). Audio output device 1004 may include any device that generates an audible indicator, such as speakers, headsets, or earbuds, for example.

Computing device 1000 may include an audio input device 1010 (or corresponding interface circuitry, as discussed above). Audio input device 1010 may include any device that generates a signal representative of a sound, such as microphones, microphone arrays, or digital instruments (e.g., instruments having a musical instrument digital interface (MIDI) output).

Computing device 1000 may include a GPS device 1009 (or corresponding interface circuitry, as discussed above). GPS device 1009 may be in communication with a satellite-based system and may receive a location of computing device 1000, as known in the art.

Computing device 1000 may include other output device 1005 (or corresponding interface circuitry, as discussed above). Examples of the other output device 1005 may include an audio codec, a video codec, a printer, a wired or wireless transmitter for providing information to other devices, or an additional storage device.

Computing device 1000 may include other input device 1011 (or corresponding interface circuitry, as discussed above). Examples of the other input device 1011 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1000 may include a security interface device 1012. Security interface device 1012 may include any device that provides security measures for computing device 1000 such as intrusion detection, biometric validation, security encode or decode, access list management, malware detection, or spyware detection, Computing device 1000, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

It is understood that the subject matter of the present description is not necessarily limited to specific applications illustrated in FIGS. 1-10. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a method comprises patterning a backbone feature over a substrate, forming a semiconductor material layer over the backbone feature and the substrate, etching the semiconductor material layer to form a sidewall spacer adjacent the backbone feature, revealing a channel portion of the sidewall spacer by removing the backbone feature, and coupling a gate structure, a source, and a drain to the channel portion.

In one or more second embodiments, further to the first embodiments, the channel portion comprises an amorphous or polycrystalline material comprising a metal and oxygen.

In one or more third embodiments, further to the first or second embodiments, the metal comprises magnesium, copper, zinc, tin, titanium, indium, gallium, or aluminum.

In one or more fourth embodiments, further to the first through third embodiments, the channel portion comprises a transition metal and one of sulfur, selenium, or tellurium.

In one or more fifth embodiments, further to the first through fourth embodiments, the transition metal comprises molybdenum or tungsten.

In one or more sixth embodiments, further to the first through fifth embodiments, the channel portion comprises silicon.

In one or more seventh embodiments, further to the first through sixth embodiments, the method further comprises forming a dielectric layer over the channel portion.

In one or more eighth embodiments, further to the first through seventh embodiments, the method further comprises forming an interface layer on the channel portion, the dielectric layer is formed on the interface layer, the dielectric layer comprising oxygen and the interface layer comprising oxygen or nitrogen.

In one or more ninth embodiments, further to the first through eighth embodiments, the dielectric layer comprises oxygen.

In one or more tenth embodiments, further to the first through ninth embodiments, the channel portion has a width of not more than 3 nm.

In one or more eleventh embodiments, an integrated circuit (IC) die comprises a first channel portion having a first sidewall and a second sidewall opposite the first sidewall, a second channel portion substantially parallel to the first channel portion, the second channel portion having a third sidewall and a fourth sidewall opposite the third sidewall, wherein the second sidewall is laterally adjacent the third sidewall, and wherein the second and third sidewalls have a first height greater than a second of the first and fourth sidewalls, and a gate structure, a source, and a drain coupled to each of the first and second channel portions.

In one or more twelfth embodiments, further to the eleventh embodiments, the first and second channel portions comprise an amorphous or polycrystalline material comprising a metal and oxygen.

In one or more thirteenth embodiments, further to the eleventh or twelfth embodiments, the metal comprises magnesium, copper, zinc, tin, titanium, indium, gallium, or aluminum.

In one or more fourteenth embodiments, further to the eleventh through thirteenth embodiments, the first and second channel portions comprise a transition metal and one of sulfur, selenium, or tellurium.

In one or more fifteenth embodiments, further to the eleventh through fourteenth embodiments, the transition metal comprises molybdenum or tungsten.

In one or more sixteenth embodiments, further to the eleventh through fifteenth embodiments, the first and second channel portions comprise silicon.

In one or more seventeenth embodiments, further to the eleventh through sixteenth embodiments, the first and second channel portions have widths of not more than 3 nm.

In one or more eighteenth embodiments, further to the eleventh through seventeenth embodiments, the IC die comprises or is thermally coupled to an active-cooling structure, the active cooling operable to remove heat from an IC die to achieve an operating temperature at or below −25° C.

In one or more nineteenth embodiments, further to the eleventh through eighteenth embodiments, the active-cooling structure comprises a plurality of microchannels, the microchannels to convey a heat transfer fluid therein.

In one or more twentieth embodiments, a method comprises receiving a substrate comprising a semiconductor material with a mask feature formed on a first portion thereof, etching a second portion of the substrate to form a feature comprising the semiconductor material, iteratively forming a passivation layer on exposed surfaces of the feature and a region of the semiconductor material adjacent the feature, anisotropically etching the passivation layer to expose the adjacent region of the semiconductor material, and further forming the feature by etching semiconductor material of the adjacent region, and removing the mask feature and forming a gate structure, a source, and a drain coupled to the feature.

In one or more twenty-first embodiments, further to the twentieth embodiments, the iteratively forming the passivation layer, the anisotropically etching the passivation layer, and the further forming the feature by etching semiconductor material are performed at least a third time before the removing the mask feature.

In one or more twenty-second embodiments, further to the twentieth or twenty-first embodiments, the feature has a first width at a first height over the substrate, a second width at a second height over the substrate and above the first height, and a third width at a third height over the substrate and above the second height, and the first and third widths are greater than the second width.

In one or more twenty-third embodiments, further to the twentieth through twenty-second embodiments, the method further comprises rounding down protrusions of the feature.

In one or more twenty-fourth embodiments, further to the twentieth through twenty-third embodiments, the method further comprises forming insulating material over the substrate and around the feature.

In one or more twenty-fifth embodiments, further to the twentieth through twenty-fourth embodiments, the semiconductor material comprises silicon.

In one or more twenty-sixth embodiments, an integrated circuit (IC) die comprises a substrate comprising a semiconductor material, a fin comprising the semiconductor material over the substrate, the fin having a first width at a first height over the substrate, a second width at a second height over the substrate and above the first height, and a third width at a third height over the substrate and above the second height, wherein the first and third widths are greater than the second width, and a gate structure, a source, and a drain coupled to a channel portion of the fin.

In one or more twenty-seventh embodiments, further to the twenty-sixth embodiments, the fin has a fourth width at a fourth height over the substrate but below the first height, and the first width is greater than the fourth width.

In one or more twenty-eighth embodiments, further to the twenty-sixth or twenty-seventh embodiments, the fin is one of a plurality of substantially parallel fins, the plurality of substantially parallel fins each being coupled to the gate structure, the source, and the drain.

In one or more twenty-ninth embodiments, further to the twenty-sixth through twenty-eighth embodiments, the semiconductor material comprises silicon.

In one or more thirtieth embodiments, further to the twenty-sixth through twenty-ninth embodiments, the IC die comprises or is thermally coupled to an active-cooling structure, the active-cooling structure to remove heat from an IC die to achieve an operating temperature at or below −25° C.

In one or more thirty-first embodiments, further to the twenty-sixth through thirtieth embodiments, the active-cooling structure comprises a plurality of microchannels, the microchannels to convey a heat transfer fluid therein.

It will be recognized that the disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. An integrated circuit (IC) die, comprising:

a substrate comprising a semiconductor material;

a fin consisting of the semiconductor material, and over the substrate, the semiconductor material of the fin having a first width at a first height over the substrate, a second width at a second height over the substrate and above the first height, and a third width at a third height over the substrate and above the second height, wherein the first and third widths are greater than the second width; and a gate structure, a source, and a drain coupled to a channel portion of the fin, wherein the IC die comprises, or is thermally coupled to, a cooling structure, the cooling structure to remove heat from the IC die to achieve an operating temperature below −25° C.

2. The IC die of claim 1, wherein the fin has a fourth width at a fourth height over the substrate but below the first height, and the first width is greater than the fourth width.

3. The IC die of claim 1, wherein the semiconductor material comprises silicon.

4. The IC die of claim 1, wherein the cooling structure is to remove heat from the IC die to achieve an operating temperature below −70° C.

5. The IC die of claim 1, wherein the semiconductor material comprises silicon.

6. The IC die of claim 1, wherein the semiconductor material has a convex sidewall defining the first and third widths.

7. An integrated circuit (IC) die, comprising:

a substrate comprising a semiconductor material;

a fin consisting of the semiconductor material, and over the substrate, the semiconductor material of the fin having a first width at a first height over the substrate, a second width at a second height over the substrate and above the first height, and a third width at a third height over the substrate and above the second height, wherein the first and third widths are greater than the second width;

a gate structure, a source, and a drain coupled to a channel portion of the fin; and an insulating material over the substrate and adjacent to the first width, but not adjacent to the second or third widths, and wherein the channel portion comprises the second and third widths of the semiconductor material.

8. The IC die of claim 7, wherein the gate structure is over the insulating material, and is coupled to the second and third widths of the semiconductor material.

9. The IC die of claim 1, wherein the semiconductor material has a fourth width at a fourth height over the third height, and a fifth width at a fifth height above the fourth height, and wherein the second and fourth widths are greater than the first, third, and fifth widths.

10. The IC die of claim 9, wherein the gate structure is coupled to the second, third, fourth and fifth widths of the semiconductor material.

* * * * *